(12) United States Patent
Yuda

(10) Patent No.: US 7,812,399 B2
(45) Date of Patent: Oct. 12, 2010

(54) SEMICONDUCTOR DEVICE COMPRISING MULTI-LAYER RECTANGULAR GATE ELECTRODE SURROUNDED ON FOUR SIDES BY SIDEWALL SPACER AND IMPLANTATION REGIONS

(75) Inventor: Takashi Yuda, Kanagawa (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 353 days.

(21) Appl. No.: 11/693,408

(22) Filed: Mar. 29, 2007

(65) Prior Publication Data

US 2007/0228483 A1 Oct. 4, 2007

(30) Foreign Application Priority Data

Mar. 31, 2006 (JP) .............................. 2006-100891

(51) Int. Cl.
*H01L 23/62* (2006.01)
(52) U.S. Cl. .............................. 257/369; 257/E21.657; 257/E21.658; 257/E21.659
(58) Field of Classification Search ................. 257/369, 257/E21.657, E21.658, E21.659
See application file for complete search history.

(56) References Cited

U.S. PATENT DOCUMENTS

| 6,049,107 | A | * | 4/2000 | Peidous | 257/336 |
| 6,670,240 | B2 | | 12/2003 | Ogura et al. | |
| 6,803,620 | B2 | | 10/2004 | Moriya et al. | |
| 2002/0137296 | A1 | * | 9/2002 | Satoh et al. | 438/301 |
| 2003/0181005 | A1 | * | 9/2003 | Hachimine et al. | 438/231 |
| 2004/0056291 | A1 | | 3/2004 | Takashima | |
| 2004/0227177 | A1 | | 11/2004 | Yoshioka et al. | |

\* cited by examiner

*Primary Examiner*—Bradley K Smith
*Assistant Examiner*—Mohammad T Karimy
(74) *Attorney, Agent, or Firm*—Rabin & Berdo, PC

(57) ABSTRACT

The present invention provides a semiconductor device which includes a gate electrode shaped in the form of an approximately quadrangular prism, including a laminated body of a gate oxide layer, a gate polysilicon layer and a gate silicon nitride layer provided in a first conduction type substrate, a second conduction type implantation region provided in a region outside the gate electrode, a sidewall that exposes a top face of the gate electrode and is formed by laminating a sidewall mask oxide layer covering side surfaces, an electron storage nitride layer and a sidewall silicon oxide layer, and a source/drain diffusion layer provided in the first conduction type substrate exposed from the gate electrode and the sidewall.

6 Claims, 26 Drawing Sheets

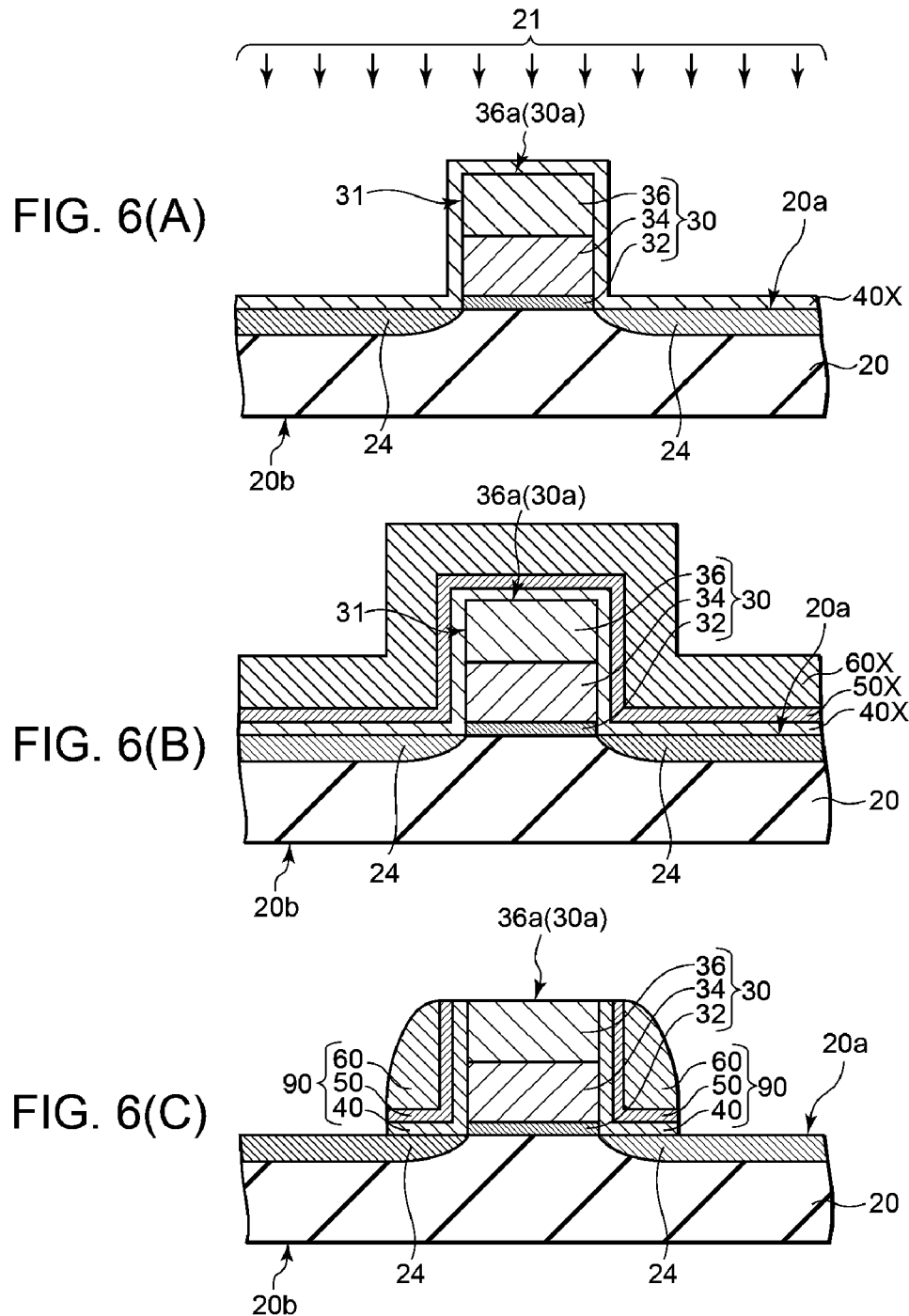

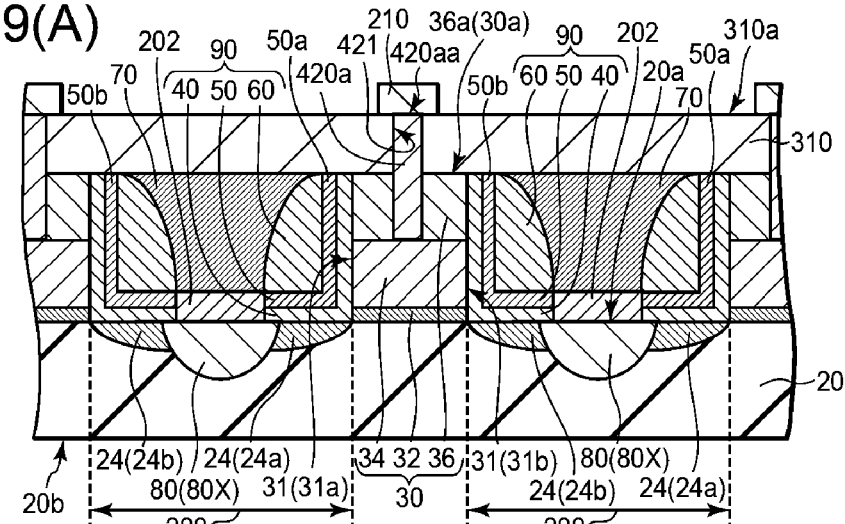
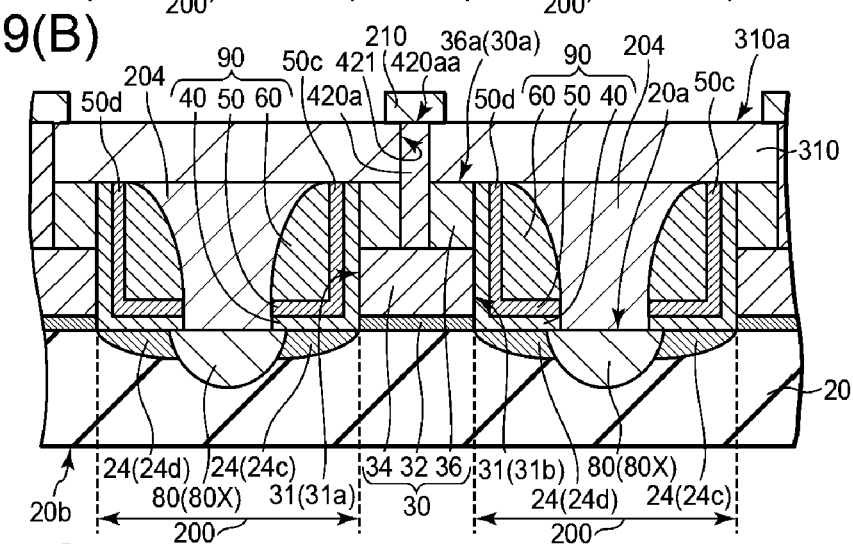
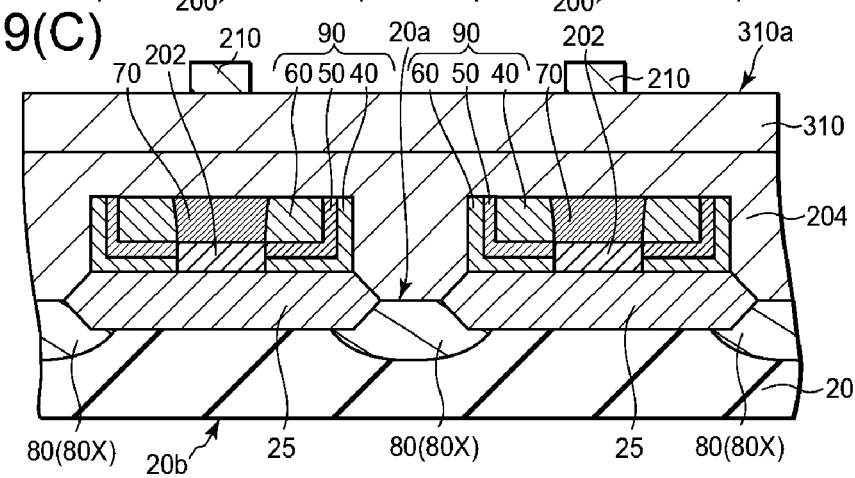

SEMICONDUCTOR DEVICE COMPRISING MULTI-LAYER RECTANGULAR GATE ELECTRODE SURROUNDED ON FOUR SIDES BY SIDEWALL SPACER AND IMPLANTATION REGIONS

BACKGROUND OF THE INVENTION

The present invention relates to a semiconductor device and a manufacturing method thereof, and particularly to a transistor element capable of performing 4-bit writing, and a semiconductor device equipped therewith and a manufacturing method thereof.

There has been known, for example, a semiconductor device that implements a ferroelectric memory cell capable of storing polarization data of a multivalue of three values or more in one ferroelectric film.

According to the configuration of the conventional semiconductor device, information equivalent to 4 bits in total are stored at positions of 4 points in total corresponding to two points of both ends as viewed in a first direction, of the ferroelectric element, and two points of both ends as viewed in a second direction orthogonal to the first direction (refer to a patent document 1 (Japanese Unexamined Patent Publication No. 2004-047593)).

With the objective of implementing a semiconductor device capable of performing a storage holding operation of 2 bits or more by one transistor and easy to make its scale-down, there has been known, for example, a configuration which includes a gate electrode and memory functional bodies formed on both sides of the gate electrode and having the function of holding electrons, and the amount of current flowing from one diffusion region to the other diffusion region at the application of a voltage to the gate electrode is changed depending on the size or magnitude of electrons held in the memory functional bodies (refer to a patent document 2 (Japanese Unexamined Patent Publication No. 2004-342927)).

An electrical characteristic of a conventional multi-valued transistor will now be explained with referent to FIG. 26.

FIG. 26 is a schematic graph showing cell current windows (memory windows) of the conventional multi-valued transistor. The vertical axis indicates a read current (Ids (Vt)) between the drain and source of the transistor, and the horizontal axis indicates the frequency.

A conventional transistor element capable of 4-bit writing/reading performs 2-bit writing/reading on one side of two side surfaces opposite to each other as viewed in the direction of a gate length of its gate electrode. Therefore, cell current windows (corresponding to intervals as viewed in the vertical axis) 100 between respective data (00, 01, 10 and 11) indicated by solid lines 110 were varied and narrowed as indicated by dotted lines 120 particularly when electrons existed in electron storage layers on the opposite sides of the gate electrode.

There is a fear that when the cell current windows are varied and narrowed as described above, the reading (determination) of the stored data from the transistor cannot be performed. As a result, there is the fear of a failure in transistor.

SUMMARY OF THE INVENTION

The present invention has been made in view of the foregoing problems. It is therefore an object of the present invention to provide a semiconductor device (semiconductor element or chip) which solves the above problems and has the following configuration.

According to one aspect of the present invention, for attaining the above object, there is provided a semiconductor device comprising a first conduction type substrate, and a gate electrode of an approximately quadrangular prism, which includes a laminated body of a gate oxide layer provided over a surface of the first conduction type substrate, a gate polysilicon layer provided over the gate oxide layer, and a gate silicon nitride layer provided over the gate polysilicon layer and which has a rectangular top face, a first side surface, a second side surface opposite to the first side surface, a third side surface located between the first side surface and the second side surface, and a fourth side surface opposite to the third side surface and located between the first side surface and the second side surface.

The semiconductor device includes a second conduction type implantation region which is provided in the first conduction type substrate including a region located outside the gate electrode and which includes a first implantation region provided in junction with the first side surface, a second implantation region provided in junction with the second side surface, a third implantation region provided in junction with the third side surface, and a fourth implantation region provided in junction with the fourth side surface.

Further, the semiconductor device has a sidewall that exposes the top face of the gate electrode and comprises a sidewall mask oxide layer covering the first side surface, the second side surface, the third side surface and the fourth side surface, an electron storage nitride layer including a first partial region opposite to the first side surface of the gate electrode, a second partial region opposite to the second side surface thereof, a third partial region opposite to the third side surface thereof, and a fourth partial region opposite to the fourth side surface thereof, and a sidewall silicon oxide layer, three of which are laminated on one another.

Furthermore, the semiconductor device is provided with a source/drain diffusion layer provided in the first conduction type substrate exposed from the gate electrode and the sidewall.

According to another aspect of the present invention, for attaining the above object, there is provided a method for manufacturing a semiconductor device comprising the following steps.

A gate oxide film is formed over a first conduction type substrate. A gate polysilicon film is formed over the gate oxide film. A gate silicon nitride film is formed over the gate polysilicon film.

The gate oxide film, the gate polysilicon film and the gate silicon nitride film are patterned to form a gate electrode of an approximately quadrangular prism, including a gate oxide layer, a gate polysilicon layer and a gate silicon nitride layer laminated over the first conduction type substrate, and having a rectangular top face, a first side surface, a second side surface opposite to the first side surface, a third side surface located between the first side surface and the second side surface, and a fourth side surface opposite to the third side surface.

A sidewall mask oxide film that covers an exposed entire surface of the first conduction type substrate and an exposed entire surface of the gate electrode is formed.

A second conduction type impurity is implanted using the gate electrode as a mask to form a second conduction type implantation region in the first conduction type substrate including a region located outside the gate electrode, the second conduction type implantation region including a first implantation region provided in junction with the first side surface, a second implantation region provided in junction with the second side surface, a third implantation region provided in junction with the third side surface, and a fourth implantation region provided in junction with the fourth side surface.

An electron storage nitride film is formed over the sidewall mask oxide film. A sidewall silicon oxide film is formed over the electron storage nitride film.

Parts of the sidewall mask oxide film, the electron storage nitride film and the sidewall silicon oxide film are removed to form a sidewall that exposes the top face of the gate electrode, reaches part of the first conduction type substrate and covers, as an integral body, the first side surface, the second side surface, the third side surface and the fourth side surface, and that comprises a sidewall mask oxide layer, an electron storage nitride layer including a first partial region opposite to the first side surface of the gate electrode, a second partial region opposite to the second side surface thereof, a third partial region opposite to the third side surface thereof, and a fourth partial region opposite to the fourth side surface thereof, and a sidewall silicon oxide layer, three of which are laminated on one another.

A second conduction type impurity is implanted in the first conduction type substrate exposed from the gate electrode and the sidewall to form a source/drain diffusion layer.

According to a configuration example of a semiconductor device of the present invention, four respective partial regions of an electron storage layer, which are opposite to four side surfaces of a gate electrode shaped in the form of an approximately quadrangular prism, hold electrons. Therefore, even though the electrons exist in the partial regions on the opposed sides in particular upon operation, the cell current windows already described above are no longer narrowed. Thus, it is possible to enhance the electrical characteristic of the semiconductor device at its operation and write or read 4-bit information more reliably.

It is also possible to prevent a failure in the semiconductor device effectively and more enhance yields.

According to an example of a method for manufacturing a semiconductor device, the semiconductor device having the above-described configuration can be manufactured efficiently and with good yields.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

FIGS. 1(A) and 1(B) are respectively typical perspective views for describing an overall configuration of a semiconductor device of the present invention, wherein FIG. 1(B) shows part of the semiconductor device in cut-away form to make it easy to understand configurations of a gate electrode and a sidewall;

FIGS. 5(A) through 5(C) are respectively typical manufacturing process views for describing a process for manufacturing a semiconductor device of the present invention, wherein FIG. 5(A) is a plan schematic view, FIG. 5(B) is a schematic view showing a cut cross-section cut along one-dot chain line III-III' of FIG. 5(A), and FIG. 5(C) is a schematic view showing a cut cross-section cut along one-dot chain line IV-IV' of FIG. 5(A);

FIGS. 6(A) through 6(C) are respectively manufacturing process views following FIG. 5(C), showing cut cross-sections cut at the same position as one-dot chain line IV-IV' of FIG. 5(A);

FIGS. 10(A) and 10(B) are respectively typical manufacturing process views for describing a manufacturing process, wherein FIG. 10(A) is a plan schematic view, and FIG. 10(B) is a schematic view showing a cut cross-section cut along one-dot chain line IV-IV' of FIG. 10(A);

FIGS. 19(A), 19(B) and 19(C) are respectively typical views respectively showing cut cross-sections cut along one-dot chain line VI-VI' of FIG. 18, one-dot chain line VII-VII' thereof and one-dot chain line VIII-VIII' thereof;

FIGS. 20(A) and 20(B) are respectively typical manufacturing process views for describing a process for manufacturing a semiconductor device of the present invention, wherein FIG. 20(A) is a plan schematic view, and FIG. 20(B) is a schematic view showing a cut cross-section cut along one-dot chain line VII-VII' of FIG. 20(A);

DETAILED DESCRIPTION OF THE PREFERRED EMBODIMENTS

Preferred embodiments of the present invention will hereinafter be described with reference to the accompanying drawings. Incidentally, the shape, size and physical relationship of each constituent element in the figures are merely approximate illustrations to enable an understanding of the present invention. The present invention is not limited to the examples illustrated in particular. Although the specific materials, conditions and numerical conditions or the like might be used in the following description, they are no more than one of preferred examples. Accordingly, the present invention is by no means limited to these preferred examples.

First Preferred Embodiment (Configuration Example 1 of Semiconductor Device)

A configuration example of a semiconductor device (which also means a semiconductor element or chip, i.e., a transistor) of the present invention will be explained with reference to FIGS. 1, 2, 3 and 4. Incidentally, the semiconductor device of the present invention features configurations of a gate electrode and a sidewall.

Figure 1A:
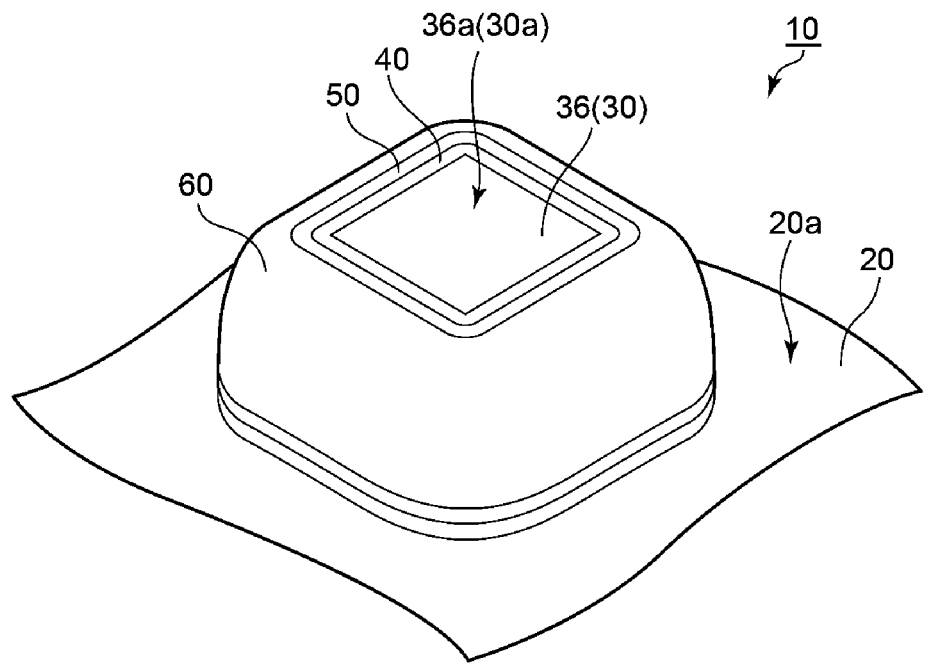
Figure 1B:
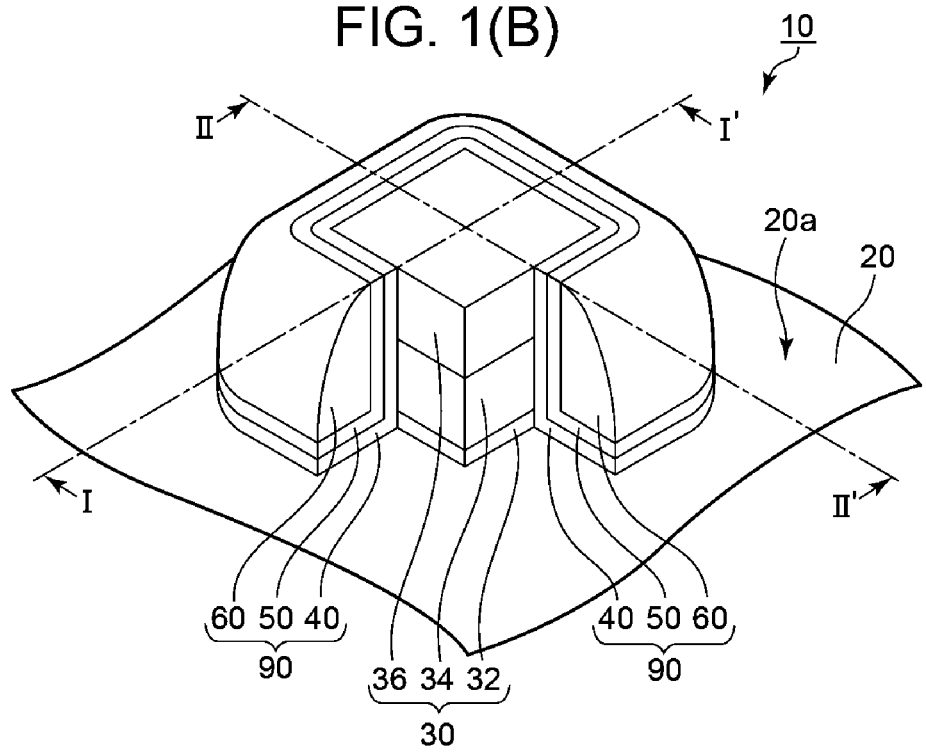

FIGS. 1(A) and 1(B) are typical perspective views for describing an overall configuration of the semiconductor device of the present invention. FIG. 1(B) shows part of the semiconductor device in cut-away form to make it easy to understand the configurations of the gate electrode and sidewall.

Figure 2:
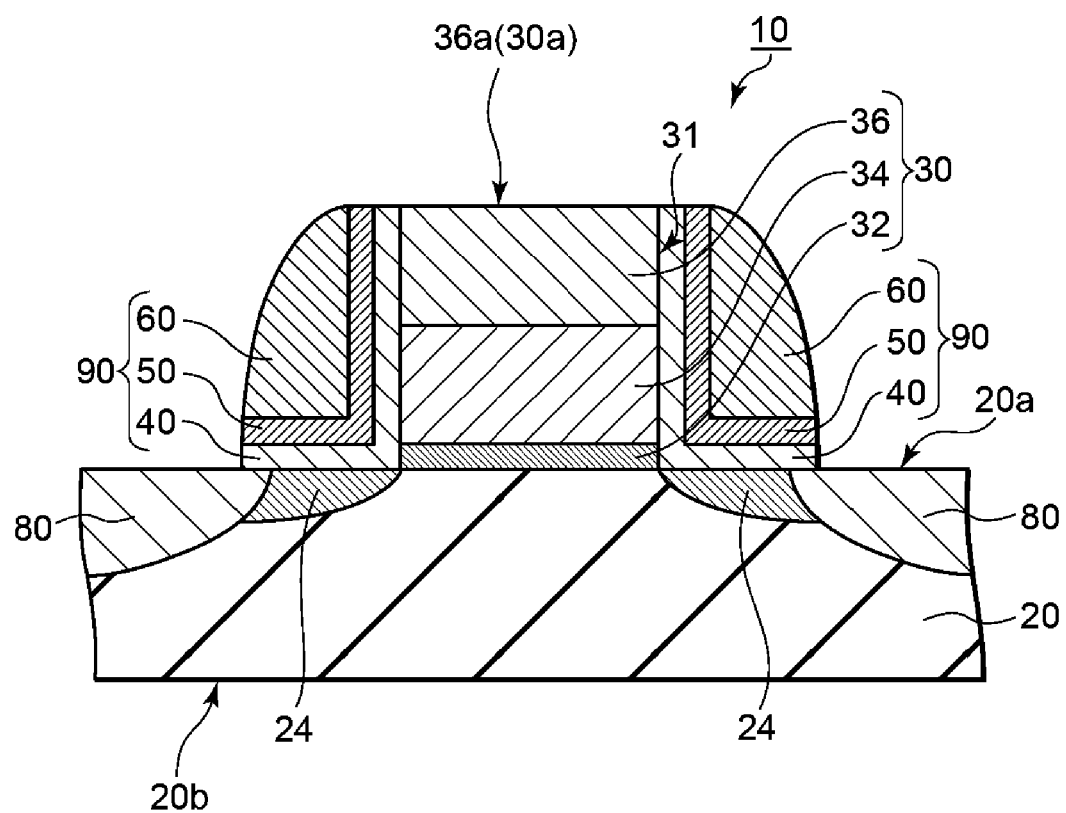
FIG. 2 is a typical view showing a cut cross-section of the semiconductor device, which is cut taken along one-dot chain line I-I' or one-dot chain line II-II' shown in FIG. 1(B)

FIG. 2 is a typical view showing a cut cross-section cut along one-dot chain line I-I' shown in FIG. 1(B) or one-dot chain line II-II' shown in FIG. 1(B).

Figure 3A:
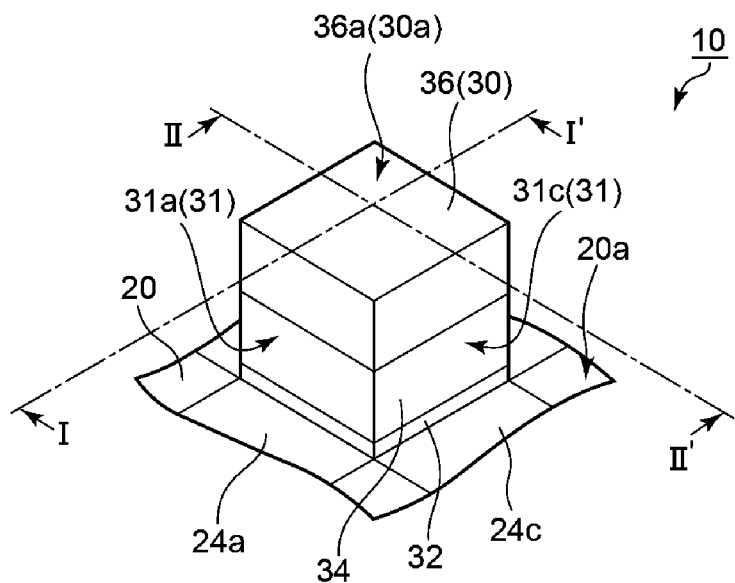
FIGS. 3(A) and 3(B) are respectively typical perspective views for describing the configuration of the gate electrode.
Figure 3B:
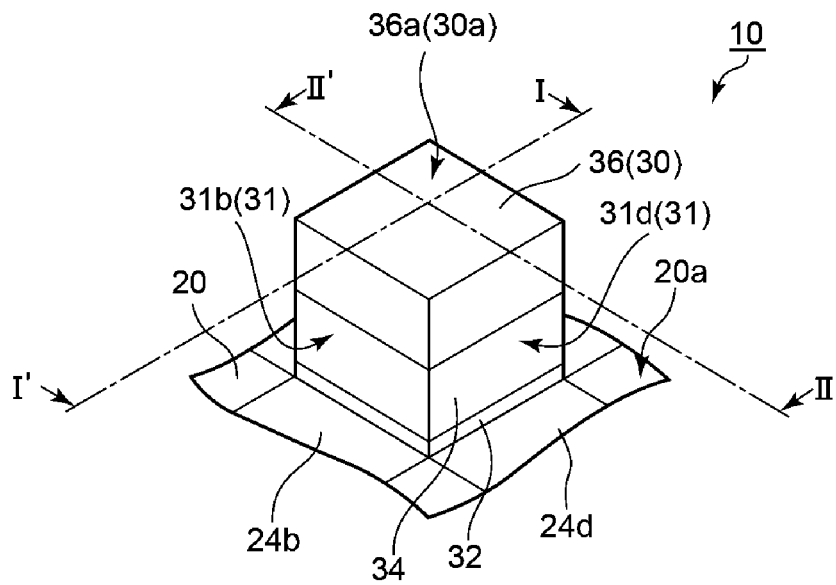

FIGS. 3(A) and 3(B) are respectively typical perspective views for describing the configuration of the gate electrode.

Figure 4A:
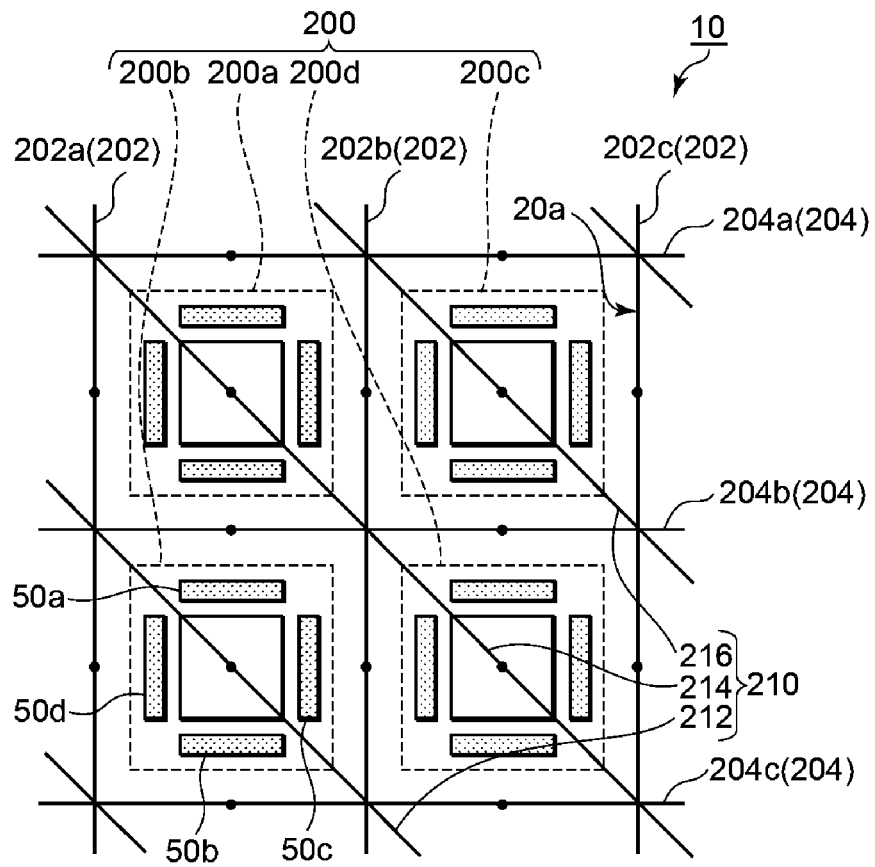
FIG. 4(A) is a typical view for describing the relationship of electrical connections of the semiconductor device.
Figure 4B:
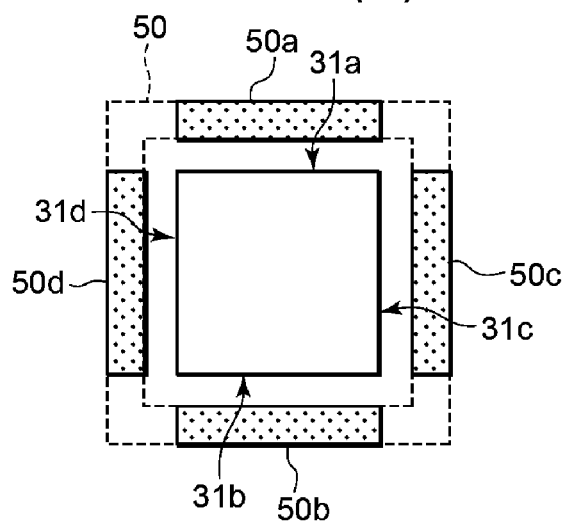
FIG. 4(B) is a partly enlarged view of FIG. 4(A)

FIG. 4(A) is a typical view for describing the relationship of electrical connections of the semiconductor device, and FIG. 4(B) is a partly enlarged view of FIG. 4(A).

As shown in FIGS. 1(A) and 1(B), the semiconductor device 10 of the present invention includes a first conduction type substrate 20. In the present example, the first conduction type substrate 20 is of a P type silicon substrate.

As shown in FIG. 2, the first conduction type substrate 20 has a front surface 20a and a back surface 20b opposite to the front surface 20a.

The semiconductor device 10 has a gate electrode 30 shaped in the form of an approximately quadrangular prism like a rectangular parallelepiped or a cube. The gate electrode 30 is provided on the front surface 20a of the first conduction type substrate 20.

The gate electrode 30 includes a gate oxide layer 32. The gate oxide layer 32 is provided in contact with the front surface 20a. The gate oxide layer 32 is of a so-called silicon oxide film in the present example.

A gate polysilicon layer 34 is laminated on the gate oxide layer 32. The gate polysilicon layer 34 is a main body that performs an essential function of the gate electrode 30.

A gate silicon nitride layer 36 is laminated on the gate polysilicon layer 34.

As shown in FIG. 3, a top face 36a of the gate silicon nitride layer 36 coincides with a top face 30a of the gate electrode 30. The top face 36a is shaped in the form of a rectangle like, for example, an oblong or a square.

A side surface 31, i.e., four surfaces of a first side surface 31a, a second side surface 31b, a third side surface 31c and a fourth side surface 31d are in junction with the four sides of the top face 36a. The first side surface 31a, the second side surface 31b, the third side surface 31c and the fourth side surface 31d are respectively shaped in the form of the rectangle like, for example, the oblong or square. Incidentally, the second side surface 31b is provided opposite to the first side surface 31a. The fourth side surface 31d is provided opposite to the third side surface 31c.

The semiconductor element 10 is provided with a second conduction type implantation region 24. The second conduction type implantation region 24 is provided in a partial area of the first conduction type substrate 20. In the present example, the second conduction type implantation region 24 is of a region in which an N-type impurity, e.g., arsenic (As) has been implanted. The second conduction type implantation region 24 is a so-called LDD (Lightly Doped Drain) region.

The second conduction type implantation region 24 is provided in a region including a region placed outside the gate electrode 30, i.e., a region directly below a sidewall 90 by an impurity implanted in a region located outside the end edges (side surface 31) of the gate electrode 30.

The second conduction type implantation region 24 includes four partial regions corresponding to a first implantation region 24a, a second implantation region 24b, a third implantation region 24c and a fourth implantation region 24d.

The first implantation region 24a is provided in junction with the first side surface 31a of the side surface 31 of the gate electrode 30. The second implantation region 24b is provided in junction with the second side surface 31b. The third implantation region 24c is provided injunction with the third side surface 311c. The fourth implantation region 24d is provided in junction with the fourth side surface 31d.

The semiconductor element 10 has a sidewall 90. That is, the gate electrode 30 has the side surface 31 covered with the sidewall 90. The sidewall 90 does not cover the top face 30a of the gate electrode 30. That is, the top face 30a of the gate electrode 30 is exposed.

The sidewall 90 included in the semiconductor element 10 of the present invention covers the first side surface 31a, second side surface 31b, third side surface 31c and fourth side surface 31d of the side surface 31 of the gate electrode 30 as an integral or united form.

A sidewall mask oxide layer 40, an electron storage nitride layer 50 and a sidewall silicon oxide layer 60 are contained in the sidewall 90 with being laminated on one another.

The sidewall mask oxide layer 40 is in contact with the side surface 31 of the gate electrode 30. Further, the sidewall mask oxide layer 40 reaches part of the front surface 20a of the first conduction type substrate 20 and covers these as an integral body or unit. As shown in FIG. 2 in particular, the sidewall mask oxide layer 40 has an L-shaped (or reverse L-shaped) configuration bent in such a manner that the partial region covering over the side surface 31 of the gate electrode 30 becomes approximately orthogonal to the partial region covering the second conduction type implantation region 24.

The electron storage nitride layer 50 is laminated on the sidewall mask oxide layer 40. As shown in FIG. 2, the electron storage nitride layer 50 also has a sectional shape similar to the sidewall mask oxide layer 40. That is, the electron storage nitride layer 50 has an L-shaped (or reverse L-shaped) configuration bent in such a manner that the partial region located on the side surface 31 of the gate electrode 30 becomes approximately orthogonal to the partial region located on the second conduction type implantation region 24.

As shown in FIG. 4(B), the electron storage nitride layer 50 includes a first partial region 50a opposite to the first side surface 31a of the gate electrode 30, a second partial region 50b opposite to the second side surface 31b, a third partial region 50c opposite to the third side surface 31c and a fourth partial region 50d opposite to the fourth side surface 31d.

Although described in detail later, the first partial region 50a, the second partial region 50b, the third partial region 50c and the fourth partial region 50d store or accumulate electrons therein independently of one another according to a data write operation. Their states correspond to data respectively different from one another.

The sidewall silicon oxide layer 60 is laminated on the electron storage nitride layer 50. The sidewall silicon oxide layer 60 is preferably, for example, a so-called NSG (Non doped Silicon Glass) oxide layer.

The sidewall silicon oxide layer 60 is provided so as to cover over the partial region corresponding to the part above the side surface 31, of the electron storage nitride layer 50 and the partial region corresponding to the part above the second conduction type implantation region 24, of the electron storage nitride layer 50.

Such a configuration as to provide, for example, an ONO (Oxide-Nitride-Oxide) film on the sidewall silicon oxide layer 60 may be taken (not shown).

As shown in FIG. 2, the semiconductor element 10 is equipped with a source/drain diffusion layer 80. The source/drain diffusion layer 80 is provided in a partial area of the first conduction type substrate 20, which is exposed from the gate electrode 30 and the sidewall 90. The second conduction type implantation region 24 and the source/drain diffusion layer 80 might extend to the side below a configuration used as a mask by thermal diffusion.

The semiconductor element 10 having the above configuration constitutes, for example, a memory cell with its plural being configured in array form.

Described specifically, as shown in FIG. 4(A), a plurality of rectangular cell areas 200 are set onto the front surface 20a of the first conduction type substrate 20 in matrix form. Two rows and two columns are shown in FIG. 4(A) as part of a matrix. That is, a first cell area 200a, a second cell area 200b, a third cell area 200c and a fourth cell area 200d are respectively shown as the cell areas 200.

The semiconductor elements 10 each having the above configuration are respectively provided in the first cell area 200a, second cell area 200b, third cell area 200c and fourth cell area 200d. In the two semiconductor elements 10 adjacent to each other, the first partial region 50a of one cell area 200 is opposite to the second partial region 50b of the other adjoining cell area 200. Similarly, the third partial region 50c of one cell area 200 is opposite to the fourth partial region 50d of the other adjoining cell area 200.

The semiconductor device 10 has a plurality of first bit lines 202 and a plurality of second bit lines 204.

The first bit line 202 is located between the third partial region 50c and the fourth partial region 50d of the adjoining cell area 200. In the present example, a first sub bit line 202a, a second sub bit line 202b and a third sub bit line 202c are shown as the first bit lines 202. The second bit line 204 is located between the first partial region 50a and the second partial region 50b of the adjoining cell area 200. In the present example, a first sub bit line 204a, a second sub bit line 204b and a third sub bit line 204c are shown as the second bit lines 204. The first bit lines 202 and the second bit lines 204 extend in the direction in which they exit along the boundary between the two cell areas 200 adjacent to each other. That is, in the present example, the first bit lines 202 extend in upward and downward directions as viewed in the drawing, and the second bit lines 204 extend in the directions orthogonal to the first bit lines 202, i.e., the horizontal direction as viewed in the drawing.

The first bit lines 202 and the second bit lines 204 are electrically unconnected to one another, that is, they are electrically independent of one another.

The first bit line 202 has the function of supplying electrons to the third partial region 50c and the four partial region 50d of the adjoining cell area 200 or drawing or taking out the same therefrom. The second bit line 204 has the function of supplying electrons to the first partial region 50a and the second partial region 50b of the adjoining cell area 200 or drawing or extracting the same therefrom.

The semiconductor device 10 has a plurality of word lines 210. The word lines 210 extend in the diagonal directions of the rectangular cell areas 200 and are provided astride the plurality of cell areas 200. The word lines 210 are electrically connected to their corresponding gate electrodes 30 of the plurality cell areas 200 over which they extend astride. In the present example, the word lines 210 include a first word line, a second word line 214 and a third word line 216.

Thus, if the word lines 210 are caused to extend in the diagonal directions of the cell areas 200, that is, the word lines 210 are respectively disposed at an angle of about 45° even with respect to any of the first, second, third and fourth partial regions 50a, 50b, 50c and 50d in the present example, then an electrical influence effected on the electron storage nitride layer 50 due to the word lines 210 is reduced upon the operation of the device, by extension, the electrical characteristic of the entire semiconductor device 10 can be stabilized.

(Operation of Semiconductor Device)

The operation of the semiconductor device 10 will now be explained with reference to FIG. 4. Here, a write operation will be described here in particular with the second cell area 200b shown in FIG. 4(A) being taken as an example. Incidentally, operating voltages are mere illustrations and can be set to arbitrary and suitable ones according to the purposes and design.

(1) Electron Storage (Write) Operation to First Partial Region 50a

A voltage of 10 volts (V) is applied to the first word line 212, a voltage of 3V is applied to the first sub bit line 202a and the second sub bit line 202b used as the first bit lines 202 respectively, a voltage of 6V is applied to the second sub bit line 204b used as the second bit line 204, and the third sub bit line 204c is set to 0V.

(2) Electron Storage Operation to Second Partial Region 50*b*

A voltage of 10 volts (V) is applied to the first word line 212, a voltage of 3V is applied to the first sub bit line 202*a* and the second sub bit line 202*b* used as the first bit lines 202 respectively, the second sub bit line 204*b* used as the second bit line 204 is set to 0V, and a voltage of 6V is applied to the third sub bit line 204*c*.

(3) Electron Storage Operation to Third Partial Region 50*c*

A voltage of 10 volts (V) is applied to the first word line 212, a voltage of 3V is applied to the second sub bit line 204*b* and the third sub bit line 204*c* used as the second bit lines 204 respectively, the first sub bit line 202*a* used as the first bit line 202 is set to 0V, and a voltage of 6V is applied to the second sub bit line 202*b*.

(4) Electron Storage Operation to Fourth Partial Region 50*d*

A voltage of 10 volts (V) is applied to the first word line 212, a voltage of 3V is applied to the second sub bit line 204*b* and the third sub bit line 204*c* used as the second bit lines 204 respectively, the second sub bit line 202*b* used as the first bit line 202 is set to 0V, and a voltage of 6V is applied to the first sub bit line 202*a*.

When the suitable voltages are applied to the source/drain diffusion layer 80 and the gate electrode 30 in this way, electrons of high energy (called also "hot electrons") are generated in the second conduction type implantation region 24 on the drain side. The hot electrons jump over the sidewall mask oxide layer 40 on the drain side and are stored in the electron storage nitride layer 50 on the drain side.

Thus, positive holes are generated in the second conduction type implantation region 24 located on the side below the electron storage nitride layer 50 with the hot electrons stored therein, thus increasing an electrical resistance. Accordingly, a flowing current is significantly reduced when the second conduction type implantation region 24 side increased in resistance functions as the source. Data determination is performed by measuring (detecting) a difference in the amount of current. Thus, quaternary data can be stored using the four partial regions of the electron storage nitride layer 50.

(Example 1 of Semiconductor Device Manufacturing Method)

An example of a method for manufacturing a semiconductor device of the present invention will be explained with reference to FIGS. 5, 6, 7 and 8.

Figure 5A:
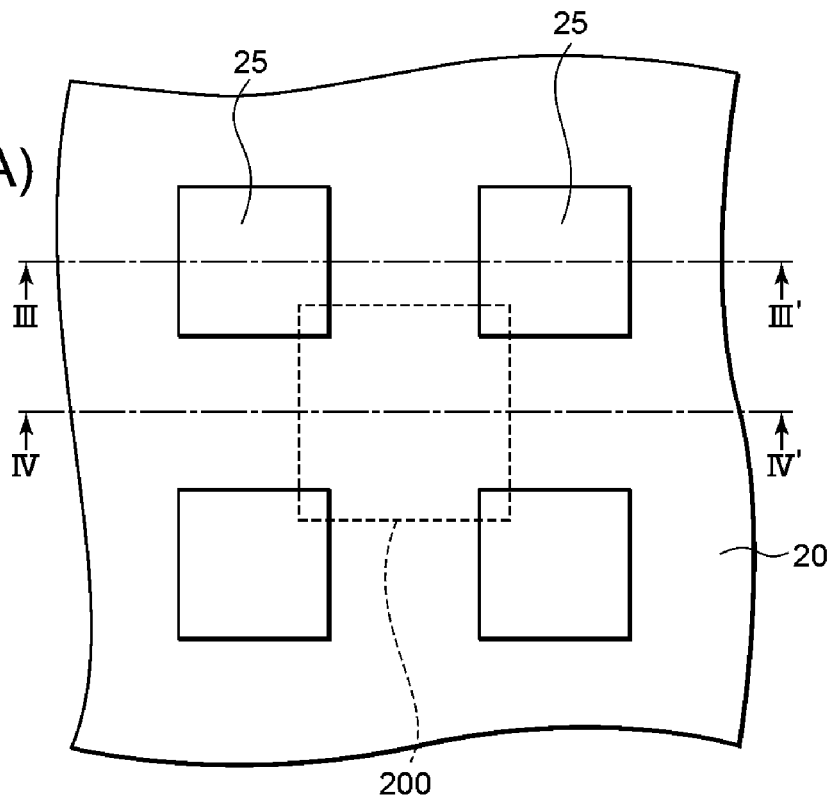
Figure 5B:
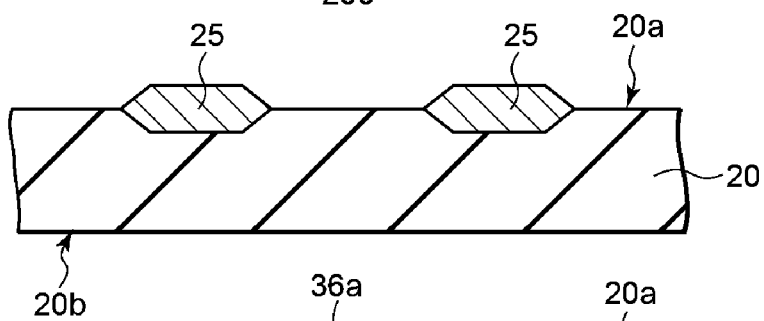
Figure 5C:
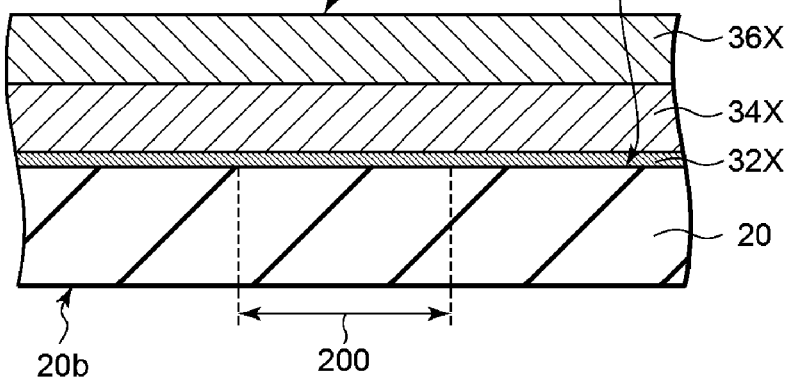

FIGS. 5(A), 5(B) and 5(C) are respectively typical manufacturing process views for describing a process for manufacturing the semiconductor device of the present invention. FIG. 5(A) is a plan schematic view of the semiconductor device, FIG. 5(B) is a schematic view showing a cut cross-section cut along one-dot chain line III-III' of FIG. 5(A), and FIG. 5(C) is a schematic view showing a cut cross-section cut along one-dot chain line IV-IV' of FIG. 5(A).

FIGS. 6(A), 6(B) and 6(C) are respectively manufacturing process views following FIG. 5(C), showing cut cross-sections each cut at the same position as one-dot chain line IV-IV' of FIG. 5(A).

Figure 7:
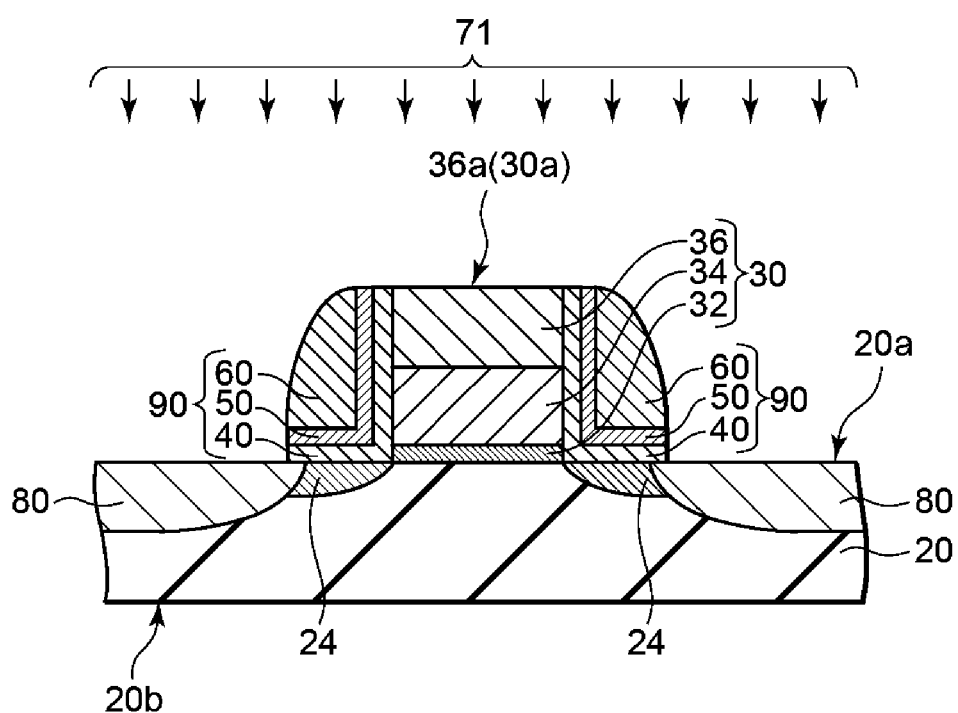
FIG. 7 is a manufacturing process view following FIG. 6(C)

FIG. 7 is a manufacturing process view following FIG. 6(C).

Figure 8A:
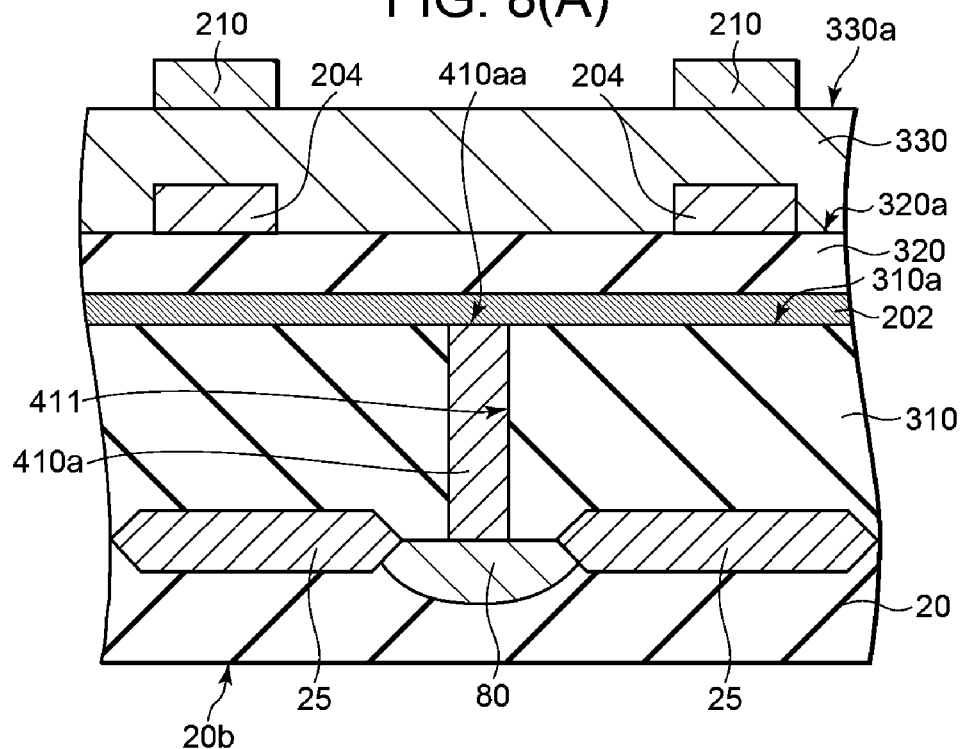
FIG. 8(A) is a manufacturing process view following FIG. 7, which is cut at the same position as one-dot chain line III-III' of FIG. 5(A)
Figure 8B:
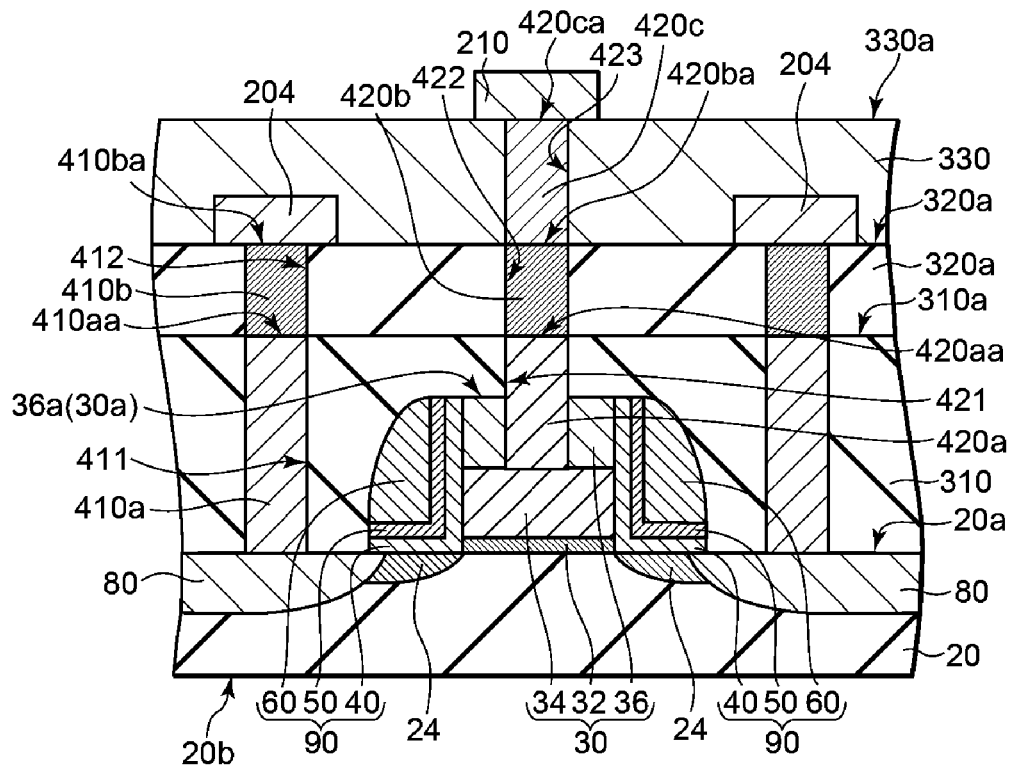
FIG. 8(B) is a manufacturing process view following FIG. 7, which is cut at the same position as one-dot chain line IV-IV' of FIG. 5(A)

FIG. 8(A) is a manufacturing process view following FIG. 7, which is cut at the same position as one-dot chain line III-III' of FIG. 5(A), and FIG. 8(B) is a manufacturing process view following FIG. 7, which is cut at the same position as one-dot chain line IV-IV' of FIG. 5(A).

As shown in FIG. 5(A), a P type (first conduction type) substrate 20 is first prepared. The P type substrate 20 has a front surface 20*a* and a back surface 20*b* opposite to the front surface 20*a*.

Element or device isolation films 25 are formed on the front surface 20*a* side of the P type substrate 20 by, for example, a LOCOS method, and a plurality of cell areas 200 spaced away from one another by the device isolation films 25 are set in matrix form (only one cell area is shown in the drawing).

Next, a gate oxide film 32X is formed on the front surface 20*a* of the exposed P type silicon substrate 20. The gate oxide film 32X may be formed by the thermal oxidation process known to date. A known arbitrary and suitable material can be used as the material for the gate oxide film 32X.

Next, a gate polysilicon film 34X is formed on the gate oxide film 32X on an arbitrary and suitable condition by a CVD method known to date.

Further, a gate silicon nitride film 36X is formed on the gate polysilicon film 34X on an arbitrary and suitable condition by the CVD method.

Next, a resist mask having a predetermined gate electrode forming pattern is formed on the gate silicon nitride film 36X by a photolithography process step known per se in the art (not shown).

Next, a laminated structure of the gate oxide film 32X, the gate polysilicon film 34X and the gate silicon nitride film 36X is patterned with the resist mask as a mask.

As shown in FIG. 6(A), a gate electrode 30 including the gate oxide layer 32, gate polysilicon layer 34 and gate silicon nitride layer 36 laminated over the P type substrate 20 is formed according to the present patterning process step.

Next, a sidewall mask oxide film 40X is formed as a thickness of 10 nm (100 angstroms) or so over the entire surface containing the front surface 20*a* of the exposed P type substrate 20 and the side surface 31 and front surface (top face) 30*a* of the gate electrode 30. This process step may preferably be performed by the thermal oxidation process step known per se in the art or the CVD method in which, for example, TEOS is used as a material, the gas flow rate is set as 150 sccm and the pressure is set as 34 Pa (pascal) (0.30 Torr).

Next, the formed gate electrode 30 is used as a mask and, for example, arsenic (As) corresponding to an N type (second conduction type) impurity 21 is implanted in the P type substrate 20 exposed from the gate electrode 30 to form an N type (second conduction type) implantation region 24.

The process of forming the N type implantation region 24 may preferably be performed on the condition that, for example, the dose of the second conduction type impurity 21 is $1 \times 10^{13}$ ions/cm$^2$ or so and implantation energy ranges from 20 KeV to 40 KeV.

As shown in FIG. 6(B), an electron storage nitride film 50X with its thickness as 8 nm or so is next formed over the entire upper surface of the formed sidewall mask oxide film 40X by, for example, the CVD method. This formation may preferably be performed assuming that, for example, a mixed gas of $NH_3/SiH_2Cl_2$ is used as the mixed gas, and their gas flow rates are respectively 1000/100 sccm and the pressure is 4.07 Pa (0.35 torr) or so.

Next, a sidewall silicon oxide film 60X is formed on the electron storage nitride film 50X. The sidewall silicon oxide film 60X may preferably be provided as an NSG oxide film formed by, for example, a plasma CVD method.

As shown in FIG. 6(C), an etching step (sidewall etching step) known per se in the art is further effected on a laminated structure of the sidewall mask oxide film 40X, the electron storage nitride film 50X and the sidewall silicon oxide film 60X to form a sidewall 90.

This sidewall etching step can be carried out as a dry etching step using a mixed gas of $CF_4$, $CHF_3$ and Ar as gas species, for example.

According to this etching step, the entire front surface 30a (front surface 36a of gate silicon nitride layer 36) of the gate electrode 30 is exposed.

With the execution of this step, the sidewall 90 is formed which covers the sidewall mask oxide layer 40, the electron storage nitride layer 50 and the side silicon oxide layer 60, and part of the P type substrate 20.

As shown in FIG. 7, an N type (second conduction type) impurity 71 corresponding to, for example, arsenic (As) is next implanted in the first conduction type substrate 20 exposed from the gate electrode 30 and the sidewall 90 to form a source/drain diffusion layer 80.

The source/drain diffusion layer 80 may preferably be formed assuming that, for example, the dose is $1\times10^{15}$ ions/$cm^2$ or so, and the implantation energy is 50 KeV or so.

As shown in FIGS. 8(A) and 8(B), a first insulating film 310 is formed which covers the exposed whole surface, i.e., the front surface 20a of the P type silicon substrate 20, the device isolation films 25, the sidewall 90 and the gate electrode 30. The first insulating film 310 is of a so-called interlayer insulating film. Thus, this process step may be defined as a step for forming a silicon oxide film by, for example, the CVD method, which is performed on an arbitrary and suitable condition.

Next, contact holes comprising first S/D (source/drain) contact holes 411 and a first gate contract hole 421 are defined in the first insulating film 310 by the photolithography and etching process steps known to date.

Each of the first S/D contact holes 411 is formed as a contact hole that reaches the source/drain diffusion layer 80 and exposes its surface. The first gate contract hole 421 is formed as a contact hole that extends through the first insulating film 310 and the gate silicon nitride layer 36 of the gate electrode 30 and thereby exposes the surface of the gate polysilicon layer 34.

Next, embedded contacts are formed by burying these contact holes with a conductive material, preferably, for example, tungsten (W) or the like.

That is, the first S/D contact holes 411 are buried to form first S/D embedded contacts 410a electrically connected to the source/drain diffusion layer 80. The first gate contact hole 421 is buried to form a first gate embedded contact 420a electrically connected to the gate polysilicon layer 34. The first S/D embedded contacts 410a and the first gate embedded contact 420a are formed so as to be substantially approximately identical in height to the surface 310a of the first insulating film 310.

Next, first bit lines 202 are formed as shown in FIG. 8(A).

The first bit lines 202 extend over the surface 310a of the first insulating film 310 and are electrically connected to the first S/D embedded contacts 410a. That is, the first bit lines 202 are formed in contact with top faces 410aa of the first S/D embedded contacts 410a respectively.

The first bit lines 202 may preferably be formed by patterning in accordance with the method known per se in the art, using a conductive material like, for example, tungsten or tungsten silicide.

Next, a second insulating film 320 corresponding to an interlayer insulating film that covers the first bit lines 202, the first insulating film 310, the first S/D embedded contacts 410a and the first gate embedded contact 420a is formed. This process step may be defined as a step for forming a silicon oxide film by, for example, the CVD method, which is performed on an arbitrary and suitable condition.

Next, as shown in FIG. 8(B), second S/D contact holes 412 for exposing the top faces 410aa of the first S/D embedded contacts 410a and a second gate contact hole 422 for exposing a top face 420aa of the first gate embedded contact 420a, both of which extend through the second insulating film 320, are formed by the photolithography and etching process steps known to date.

Next, embedded contacts are formed by burying these contact holes with a conductive material, preferably, for example, tungsten (W) or the like.

That is, the second S/D contact holes 412 are buried to form second S/D embedded contacts 410b electrically connected to the first S/D embedded contacts 410a. The second gate contact hole 422 is buried to form a second gate embedded contact 420b electrically connected to the first gate embedded contact 420a. The second S/D embedded contacts 410b and the second gate embedded contact 420b are formed so as to be substantially approximately identical in height to a surface 320a of the second insulating film 320.

Next, second bit lines 204 are formed.

The second bit lines 204 extend over the surface 320a of the second insulating film 320 and are electrically connected to their corresponding second S/D embedded contacts 410b. That is, the second bit lines 204 are formed in contact with their corresponding top faces 410ba of the second S/D embedded contacts 410b.

The second bit lines 204 may preferably be formed by patterning in accordance with the method known per se in the art, using a conductive material like, for example, tungsten or tungsten silicide.

Next, a third insulating film 330 corresponding to an interlayer insulating film that covers the second bit lines 204 is formed. This process step may be defined as a step for forming a silicon oxide film by, for example, the CVD method, which is performed on an arbitrary and suitable condition.

A description will further be made in association with FIG. 4(A). A plurality of first bit lines 202 are electrically connected to their corresponding source/drain diffusion layers 80 held in contact with a first implantation region 24a in one cell area 200 of a plurality of cell areas 200 arranged in matrix form and a second implantation region 24b in the other cell area 200 thereof. A plurality of second bit lines 204 are electrically independent of the first bit lines 202 and electrically connected to their corresponding source/drain diffusion layers 80 held in contact with a third implantation region 24c in one cell area 200 and a fourth implantation region 24d in the other cell area 200.

Next, a third gate contact hole 423, which extends through the third insulating film 330 and exposes a top face 420ba of the second gate embedded contact 420b, is formed by the photolithography and etching process steps known to date.

Next, embedded contacts are formed by burying these contact holes with a conductive material, preferably, for example, tungsten (W) or the like.

That is, the third gate contact hole 423 is buried to form a third gate embedded contact 420c electrically connected to its corresponding second gate embedded contact 420b. The third gate embedded contact 420c is formed so as to be substantially approximately identical in height to the surface 330a of the third insulating film 330.

Word lines 210 are next formed.

Each of the word lines 210 extends over the surface 330a of the third insulating film 330 and is electrically connected to the third gate embedded contact 420c. That is, the word line 210 is formed in contact with its corresponding top face 420ca of the third gate embedded contact 420c.

The word lines 210 may preferably be formed by patterning in accordance with the method known per se in the art, using a conductive material like, for example, tungsten or tungsten silicide.

Second Preferred Embodiment (Configuration Example 2 of Semiconductor Device)

A configuration example of a semiconductor device of the present invention will be explained with reference to FIGS. 9(A) and 9(B). Incidentally, the semiconductor device of the present example has a feature in that the position of a gate electrode is shifted between adjacent sidewalls as compared with the first embodiment already described above.

Figure 9A:
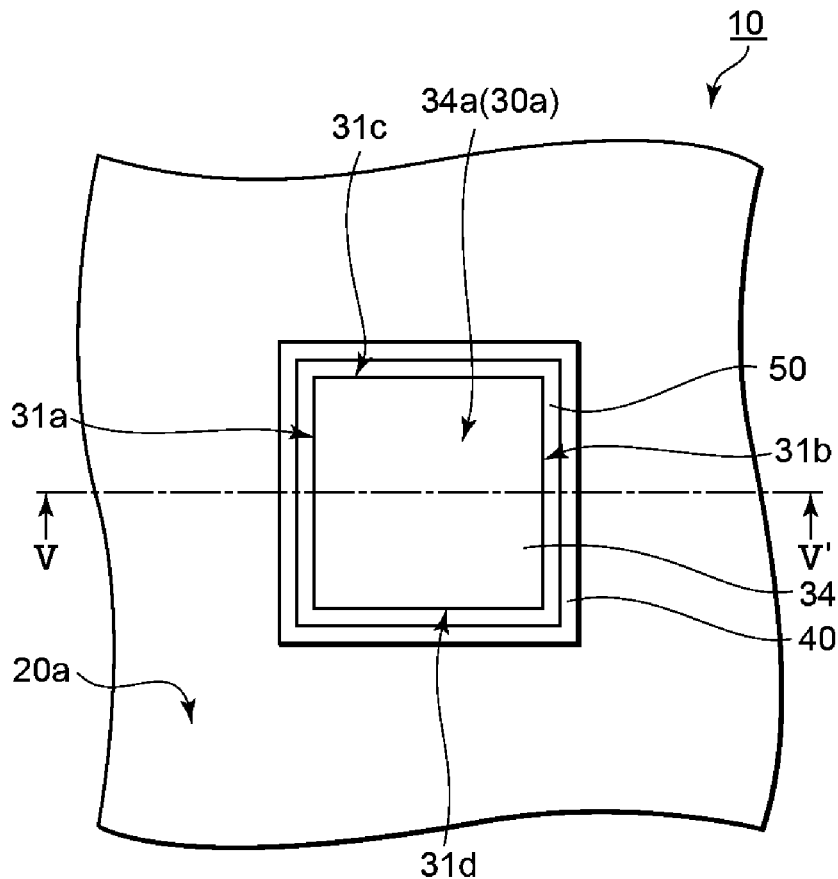
FIG. 9(A) is a plan typical view of the semiconductor device as viewed from the side of its upper surface.
Figure 9B:
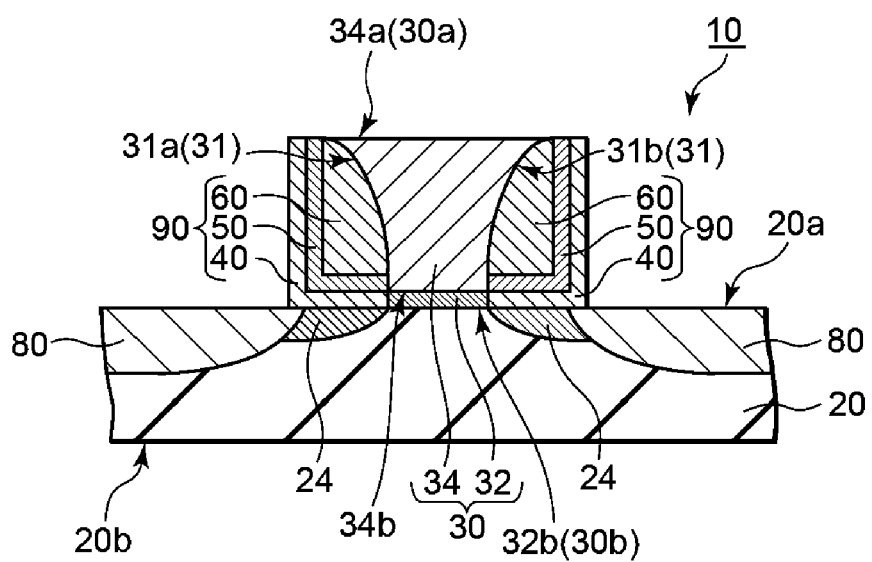
FIG. 9(B) is a typical view showing a cut cross-section cut along one-dot chain line V-V' of FIG. 9(A)

FIG. 9(A) is a plan typical view of the semiconductor device as viewed from its upper surface side, and FIG. 9(B) is a typical view illustrating a cut cross-section cut along one-dot chain line V-V' shown in FIG. 9(A).

As shown in FIGS. 9(A) and 9(B), the semiconductor device 10 includes a first conduction type substrate 20. In the present example, the first conduction type substrate 20 is of a P type substrate.

As shown in FIG. 9(B), the first conduction type substrate 20 has a front surface 20a and a back surface 20b opposite to the front surface 20a.

The semiconductor device 10 has a gate electrode shaped in the form of an approximately quadrangular prism, having a so-called inversely-tapered side surface, wherein a top face 30a and a bottom face 30b are different in area, i.e., the area of the top face 30a is larger than that of the bottom face 30b in the present example. The gate electrode 30 is provided on the front surface 20a of the first conduction type substrate 20.

The gate electrode 30 includes a gate oxide layer 32. The gate oxide layer 32 is provided in contact with the front surface 20a. The gate oxide layer 32 is of a so-called silicon oxide film in the present example.

A gate polysilicon layer 34 is provided on the gate oxide layer 32 with being laminated thereon. The gate polysilicon layer 34 is a main body that performs an essential function of the gate electrode 30.

A front surface or surface 34a of the gate polysilicon layer 34 coincides with the top face 30a of the gate electrode 30. The surface 34a is shaped in the form of an arbitrary rectangle like, for example, an oblong or a square.

A side surface 31, i.e., four surfaces of a first side surface 31a, a second side surface 31b, a third side surface 31c and a fourth side surface 31d are in junction with the four sides of a surface 36a. The first side surface 31a, the second side surface 31b, the third side surface 31c and the fourth side surface 31d are respectively shaped in the form of a rectangle like, for example, the oblong or square. Incidentally, the second side surface 31b is provided opposite to the first side surface 31a. The fourth side surface 31d is provided opposite to the third side surface 31c.

The semiconductor element 10 is provided with a second conduction type implantation region 24. The second conduction type implantation region 24 is provided in a partial area of the first conduction type substrate 20. In the present example, the second conduction type implantation region 24 is of a region in which an N-type impurity, e.g., arsenic (As) has been implanted. The second conduction type implantation region 24 is a so-called LDD (Lightly Doped Drain) region.

The second conduction type implantation region 24 is provided in a region including a region placed outside the gate electrode 30, i.e., a region directly below a sidewall 90 by an impurity implanted in a region located outside the end edges (side surface 31) of the gate electrode 30.

The second conduction type implantation region 24 includes four partial regions corresponding to a first implantation region 24a, a second implantation region 24b, a third implantation region 24c and a fourth implantation region 24d.

The first implantation region 24a is provided in junction with the first side surface 31a of the side surface 31 of the gate electrode 30. The second implantation region 24b is provided in junction with the second side surface 31b. The third implantation region 24c is provided in junction with the third side surface 311c. The fourth implantation region 24d is provided in junction with the fourth side surface 31d.

The semiconductor element 10 has a sidewall 90. That is, the gate electrode 30 has the side surface 31 covered with the sidewall 90. The sidewall 90 does not cover the top face 30a of the gate electrode 30. That is, the top face 30a of the gate electrode 30 is exposed.

The sidewall 90 provided in the semiconductor element 10 of the present invention covers the first side surface 31a, second side surface 31b, third side surface 31c and fourth side surface 31d of the side surface 31 of the gate electrode 30 as an integral or united form.

A sidewall mask oxide layer 40, an electron storage nitride layer 50 and a sidewall silicon oxide layer 60 are contained in the sidewall 90 with being laminated on one another.

In the present example, the sidewall silicon oxide layer 60 covers the side surface 31 of the gate electrode 30 in contact with the side surface 31 thereof. The sidewall silicon oxide layer 60 is laminated on the electron storage nitride layer 50. The sidewall silicon oxide layer 60 is preferably, for example, a so-called NSG (Non doped Silicon Glass) oxide layer.

The sidewall silicon oxide layer 60 is provided so as to cover over a partial region corresponding to the part above the side surface 31, of the electron storage nitride layer 50 and a partial region corresponding to the part above the second conduction type implantation region 24, of the electron storage nitride layer 50.

The electron storage nitride layer 50 is laminated on the sidewall silicon oxide layer 60. The electron storage nitride layer 50 has an L-shaped (or reverse L-shaped) configuration bent in such a manner that the partial region located over the side surface 31 of the gate electrode 30 becomes approximately orthogonal to the partial region located over the second conduction type implantation region 24.

As shown in FIG. 4(B), the electron storage nitride layer 50 employed in the present example also includes a first partial region 50a opposite to the first side surface 31a of the gate electrode 30, a second partial region 50b opposite to the second side surface 31b, a third partial region 50c opposite to the third side surface 31c and a fourth partial region 50d opposite to the fourth side surface 31d.

A sidewall mask oxide layer 40 is provided outside the electron storage nitride layer 50.

In a manner similar to the electron storage nitride layer 50, the sidewall mask oxide layer 40 has an L-shaped (or reverse L-shaped) configuration bent in such a manner that the partial region covering over the side surface 31 of the gate electrode 30 becomes approximately orthogonal to the partial region covering the second conduction type implantation region 24.

Such a configuration as to provide, for example, an ONO film even on the sidewall mask oxide layer 40 may further be taken (not shown).

As shown in FIG. 9(B), the semiconductor element 10 is equipped with a source/drain diffusion layer 80. The source/drain diffusion layer 80 is provided in a partial area of the first conduction type substrate 20, which is exposed from the gate electrode 30 and the sidewall 90. The second conduction type implantation region 24 and the source/drain diffusion layer 80 might extend to the side below a configuration used as a mask by thermal diffusion.

Although specific explanations are omitted because of the same configuration, the semiconductor element 10 of the present example also constitutes a memory cell with its plural being configured in array form, in a manner similar to the first embodiment already described with reference to FIG. 4(A).

A plurality of rectangular cell areas 200 are set onto the front surface 20a of the first conduction type substrate 20 in matrix form.

The semiconductor device 10 has a plurality of first bit lines 202 and a plurality of second bit lines 204.

The second bit lines 204 extend in the direction in which they are respectively orthogonal to the first bit lines 202.

The first bit lines 202 and the second bit lines 204 are electrically unconnected to one another, that is, they are electrically independent of one another.

The semiconductor device 10 is provided with a plurality of word lines 210. The word lines 210 extend in the diagonal directions of the rectangular cell areas 200 and are provided astride the plurality of cell areas 200. The word lines 210 are electrically connected to their corresponding gate electrodes 30 of the cell areas 200 over which they extend astride.

Since the bottom area of each gate electrode 30 can be made smaller if such a configuration is taken, the area occupied on the substrate, per transistor (semiconductor device) can be reduced, that is, a cell size can be made small and the degree of integration can be more enhanced.

(Example 2 of Semiconductor Device Manufacturing Method)

An example of a method for manufacturing a semiconductor device of the present example will be explained with reference to FIGS. 10, 11, 12, 13, 14 and 15.

Figure 10A:
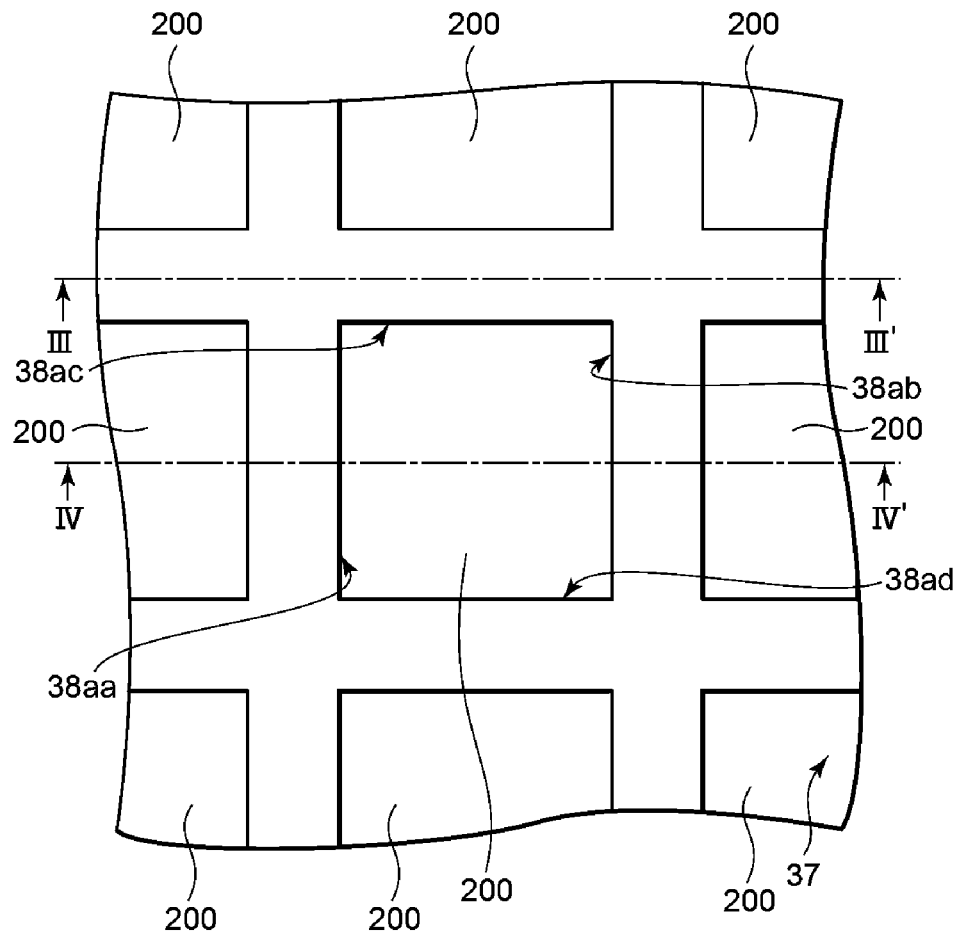
Figure 10B:
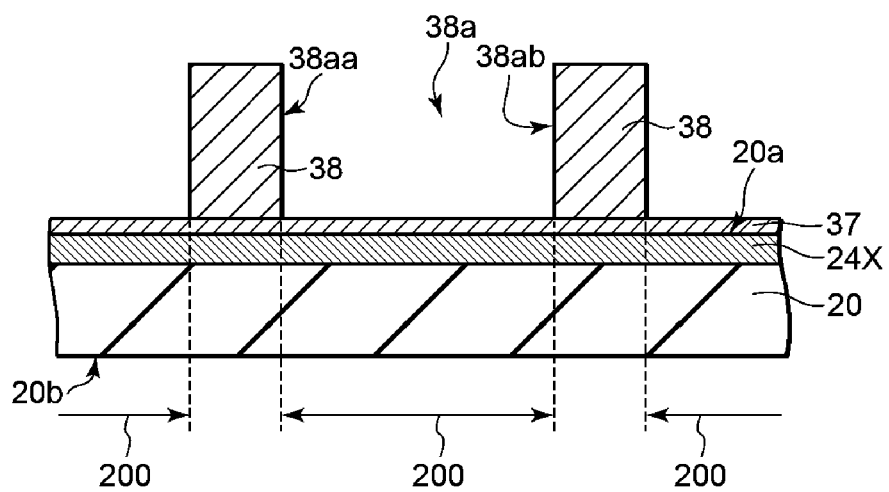

FIGS. 10(A) and 10(B) are respectively typical manufacturing process views for describing a process for manufacturing the semiconductor device. FIG. 10(A) is a plan schematic view of the semiconductor device, and FIG. 10(B) is a schematic view showing a cut cross-section cut along one-dot chain line IV-IV' of FIG. 10(A).

Figure 11:
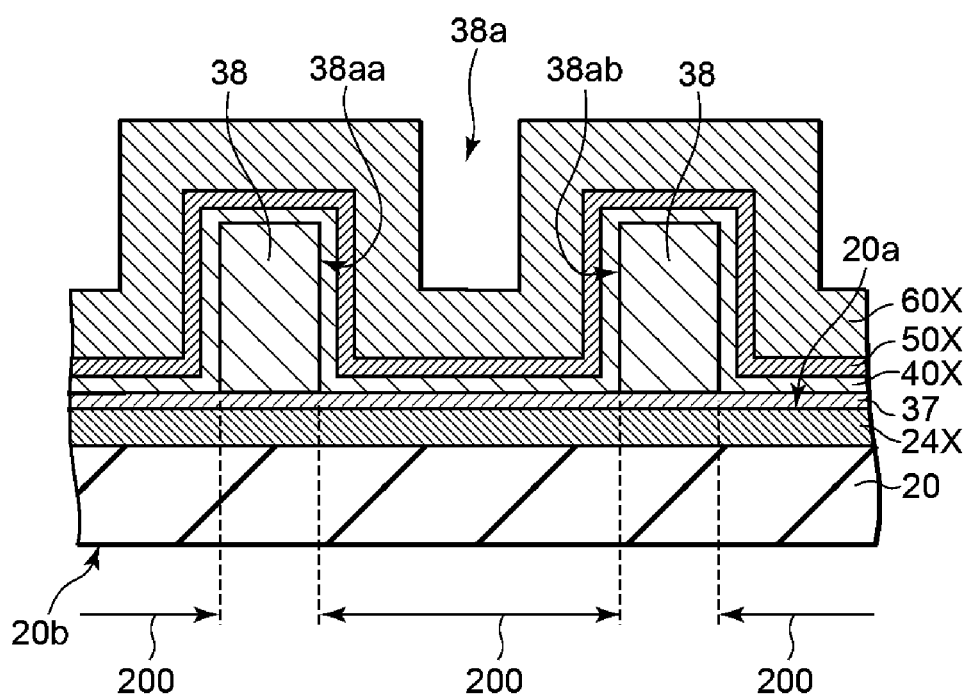
FIG. 11 is a manufacturing process view of the semiconductor device, following FIG. 10(B)

FIG. 11 is a semiconductor device manufacturing process view following FIG. 10(B).

Figure 12A:
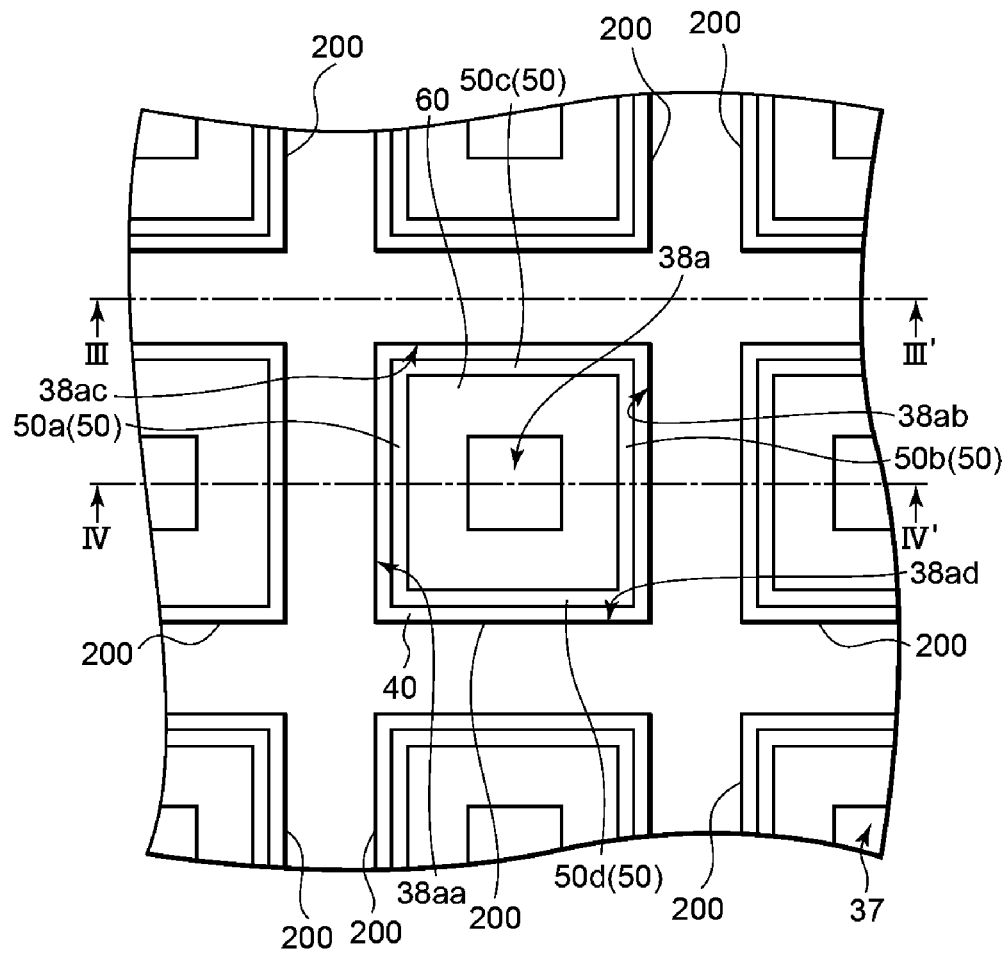
FIG. 12(A) is a plan schematic view.
Figure 12B:
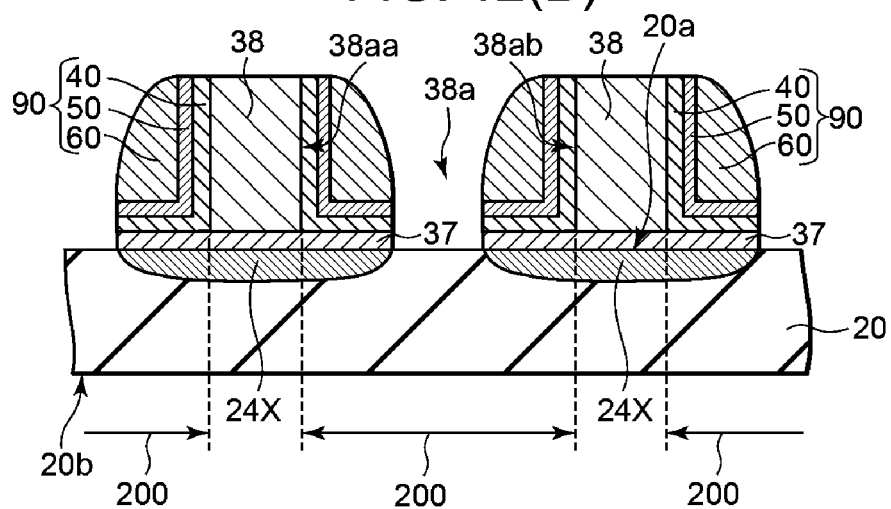
FIG. 12(B) is a schematic view showing a cut cross-section cut along one-dot chain line IV-IV' of FIG. 12(A)

FIG. 12(A) is a plan schematic view, and FIG. 12(B) is a schematic view showing a cut cross-section cut along one-dot chain line IV-IV' of FIG. 12(A).

Figure 13A:
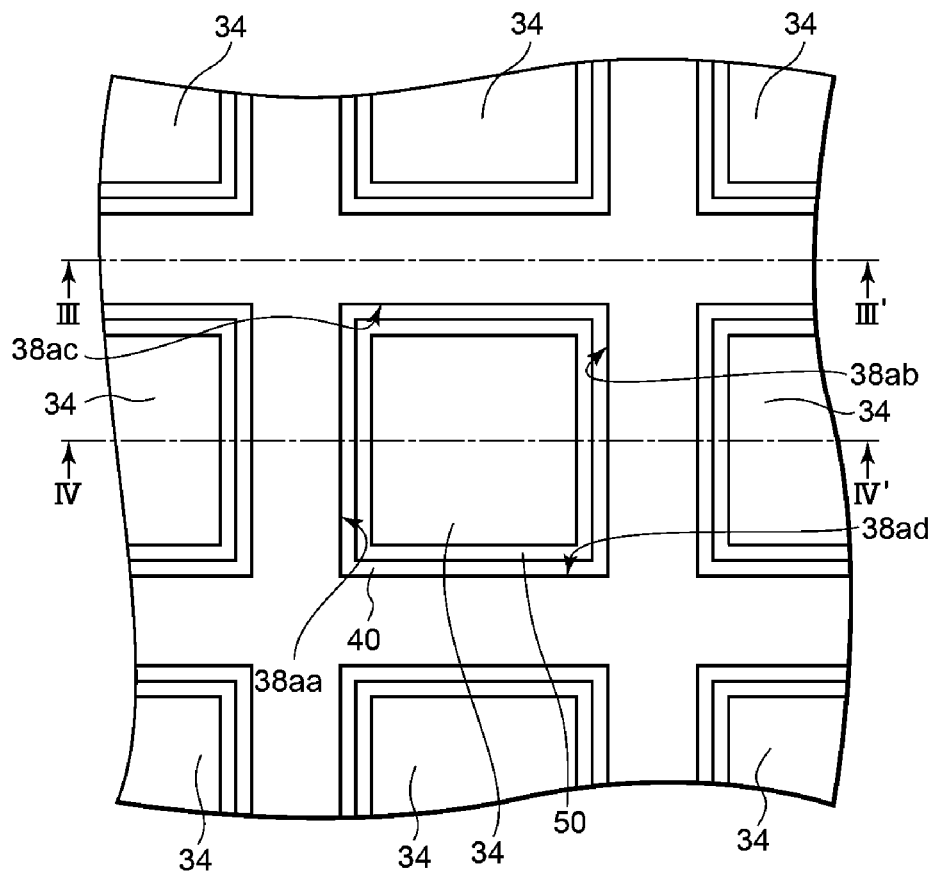
FIG. 13(A) is a plan schematic view.
Figure 13B:
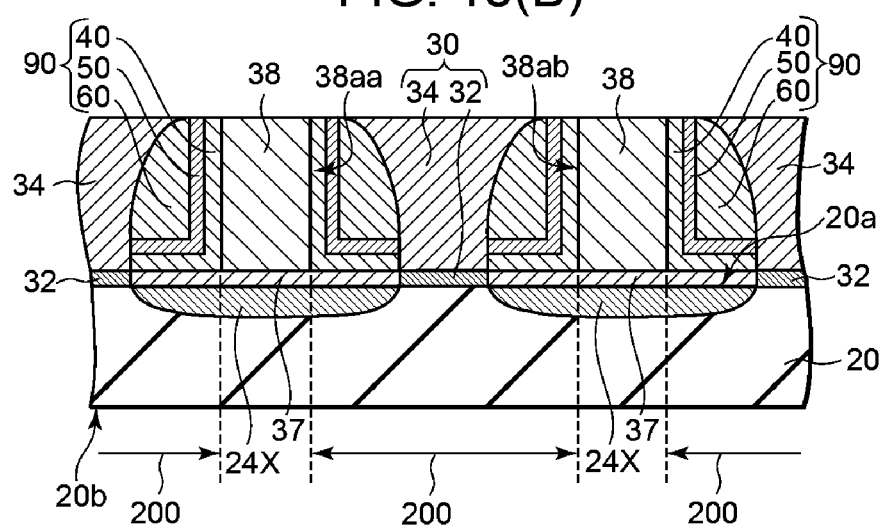
FIG. 13(B) is a schematic view showing a cut cross-section cut along one-dot chain line IV-IV' of FIG. 13(A)

FIG. 13(A) is a plan schematic view, and FIG. 13(B) is a schematic view showing a cut cross-section cut along one-dot chain line IV-IV' of FIG. 13(A).

Figure 14A:
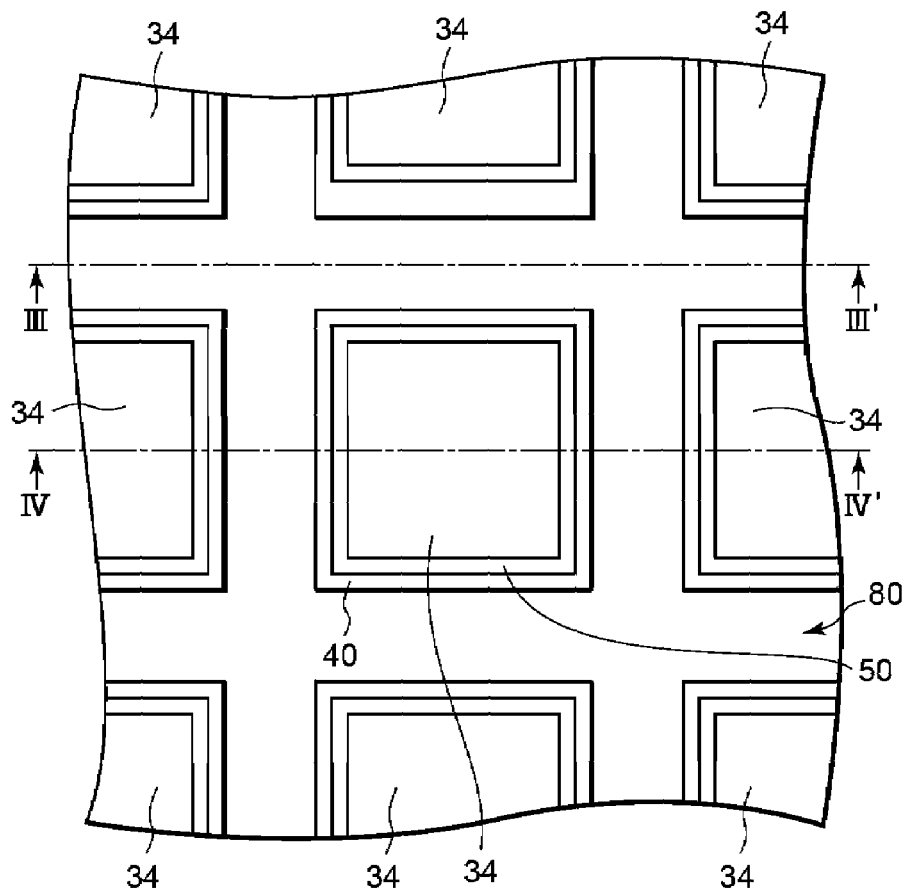
FIG. 14(A) is a plan schematic view.
Figure 14B:
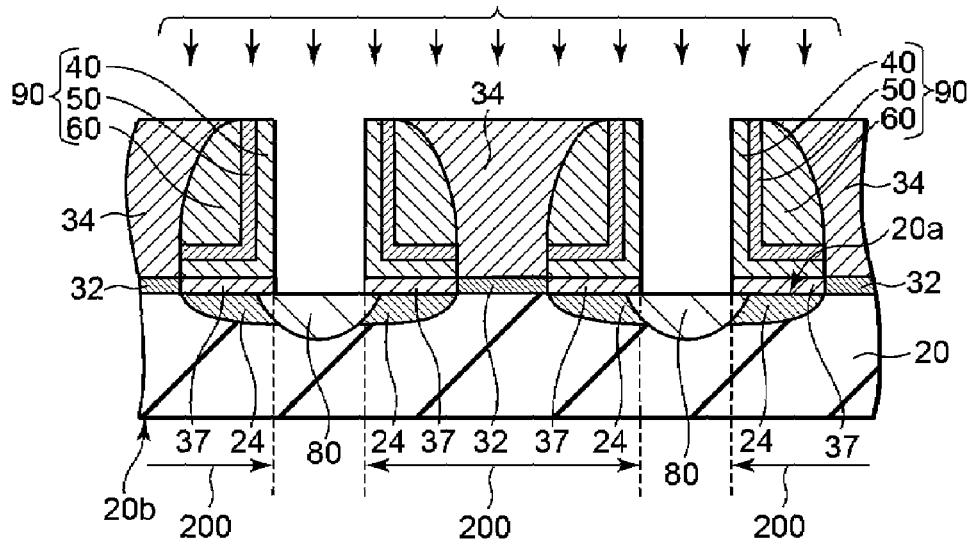
FIG. 14(B) is a schematic view showing a cut cross-section cut along one-dot chain line IV-IV' of FIG. 14(A)

FIG. 14(A) is a plan schematic view, and FIG. 14(B) is a schematic view showing a cut cross-section cut along one-dot chain line IV-IV' of FIG. 14(A).

Figure 15A:
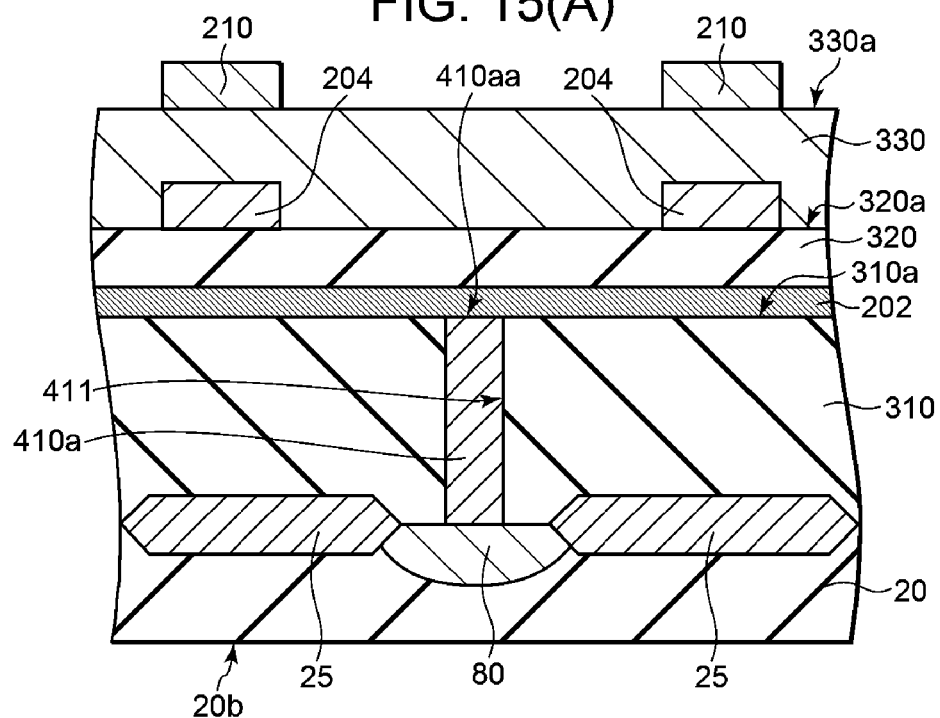
FIG. 15(A) is a schematic view illustrating a cut cross-section cut along one-dot chain line III-III' of FIG. 14(A)
Figure 15B:
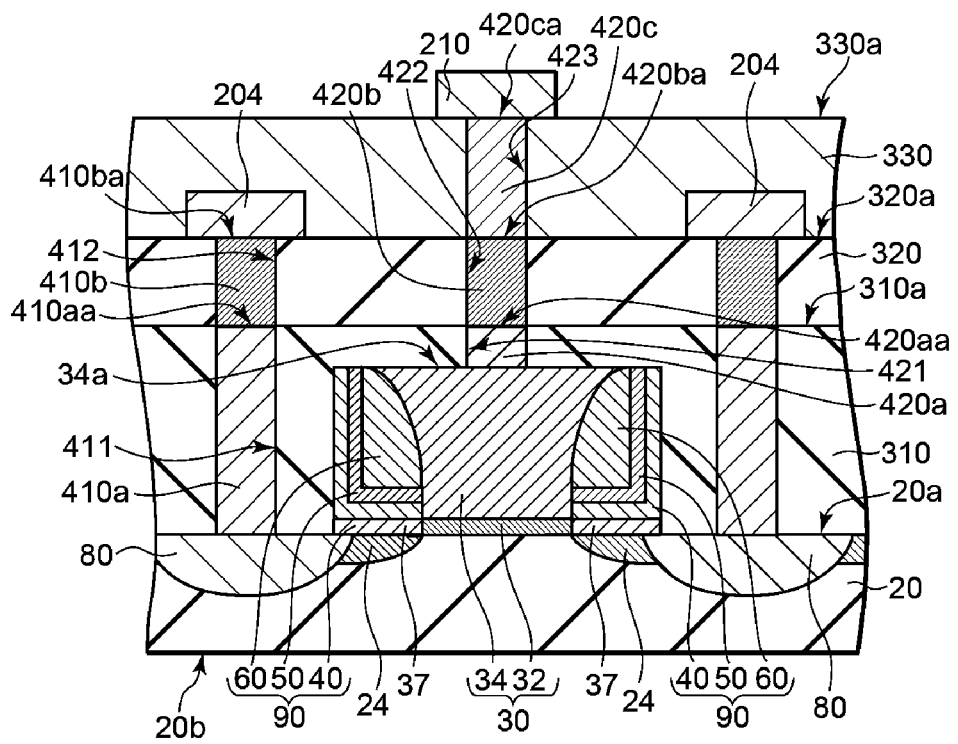
FIG. 15(B) is a schematic view showing a cut cross-section cut along one-dot chain line IV-IV' of FIG. 14(A)

FIG. 15(A) is a schematic view showing a cut cross-section cut along one-dot chain line III-III' of FIG. 14(A), and FIG. 15(B) is a schematic view following FIG. 14(B), showing a cut cross-section cut along one-dot chain line IV-IV' of FIG. 14(A).

Incidentally, since constitutions marked with the same reference numerals as those in the already-described first embodiment can be formed in like manner in the manufacturing process of the present example, their detailed explanations are omitted.

As shown in FIGS. 10(A) and 10(B), a P type (first conduction type) substrate 20 is first prepared. The P type substrate 20 has a front surface 20a and a back surface 20b opposite to the front surface 20a.

In a manner similar to the above example, element or device isolation films are formed on the front surface 20a side of the P type substrate 20 by, for example, a LOCOS method. A plurality of cell areas 200 spaced away from one another by the device isolation films are set in matrix form (device isolation films are not shown in the drawings).

Next, for example, arsenic (As) corresponding to an N type (second conduction type) impurity is implanted in the P type substrate 20 to form each precursor second conduction type implantation region 24X.

Next, a sacrifice oxide film 37 is formed on the exposed front surface 20a of P type substrate. The sacrifice oxide film 37 may be formed by the thermal oxidation process step known to date.

A sacrifice nitride film 38 is formed on the sacrifice oxide film 37. As the sacrifice nitride film 38, for example, for example, a silicon nitride film may be deposited or grown on an arbitrary and suitable condition by a deposition method such as a CVD method known to date.

Next, as shown in FIG. 10, the sacrifice nitride film 38 is patterned by the known photolithography and etching process steps.

Described specifically, a resist mask, which makes open an area corresponding to each cell area 200, is formed on the sacrifice nitride film 38. Using the resist mask as a mask, the sacrifice nitride film 38 is etched until the sacrifice oxide film 37 is exposed, thereby to pattern the sacrifice nitride film 38 in lattice form, whereby an opening or aperture 38a is formed. The aperture 38a extends from the highest portion as viewed in the direction of thickness of the sacrifice nitride film 38 to the surface of the sacrifice oxide film 37 and forms an approximately rectangular parallelepiped-shaped space, i.e., a concave portion at which its upper portion (upper surface) is released or made open.

The aperture 38a includes a first side surface 38aa, a second side surface 38ab opposite to the first side surface 38aa, a third side surface 38ac located between the first side surface 38aa and the second side surface 38ab and placed injunction or connection with the first side surface 38aa and the second side surface 38ab, and a fourth side surface 38ad, which is opposite to the third side surface 38ac and which is located between the first side surface 38aa and the second side surface 38ab and placed injunction or connection with the first side surface 38aa and the second side surface 38ab.

Next, as shown in FIG. 11, a sidewall mask oxide film 40X is formed over the entire surfaces of the exposed sacrifice oxide film 37 and sacrifice nitride film 38.

Further, an electron storage nitride film 50X is formed on the sidewall mask oxide film 40X.

Next, a sidewall silicon oxide film 60X is formed on the electron storage nitride film 50X.

As shown in FIGS. 12(A) and 12(B), the sidewall mask oxide film 40X, the electron storage nitride film 50X and the sidewall silicon oxide film 60X are then respectively partly removed until the surface of the sacrifice nitride film 38 is exposed, whereby a sidewall 90 having the sidewall mask oxide layer 40, the electron storage nitride layer 50 and the sidewall silicon oxide layer 60 laminated on one another is formed which extends from the highest point as viewed in the direction of thickness of the sacrifice nitride film 38 to part of the first conduction type substrate 20.

According to this process step, an electron storage nitride layer 50 is formed as a configuration or constitution including a first partial region 50a opposite to the first side surface 38aa of the aperture 38a, a second partial region 50b opposite to the second side surface 38ab, a third partial region 50c opposite to the third side surface 38ac, and a fourth partial region 50d opposite to the fourth side surface 38ad.

Further, the sacrifice oxide film 37 exposed from the aperture 38a is selectively removed by, for example, an etching step executed on an arbitrary and suitable condition.

Next, for example, boron (B) corresponding to a P type (first conduction type) impurity is implanted using the formed sidewall 90 and remaining sacrifice nitride film 38 as masks to thereby separate precursor second conduction type implantation regions 24X.

As shown in FIGS. 13(A) and 13(B), a gate oxide layer 32 is subsequently formed on the surface of the exposed first conduction type substrate 20.

Next, a gate polysilicon film 34X is formed on the gate oxide layer 32. The gate polysilicon film 34X is removed until the sacrifice nitride film 38 is exposed.

This process step may preferably be performed by, for example, an etching process step or a CMP process step, which is performed on an arbitrary and suitable condition.

Such a gate polysilicon layer 34 that each aperture (38a) is buried therewith up to substantially the same height as the height as viewed in the direction of thickness of the sacrifice nitride film 38 is formed according to this process step.

Thus, a plurality of gate electrodes 30 each having the gate oxide layer 32 and the gate polysilicon layer 34 both of which are laminated on each other, are completed within the plurality of cell areas 200.

As shown in FIGS. 14(A) and 14(A), the sacrifice oxide film 37 exposed from the sacrifice nitride film 38 and the sidewall 90 is next selectively removed by the etching step executed on the arbitrary and suitable condition.

Next, a second conduction type impurity is implanted to form a second conduction type implantation region 24 in each cell area 200 of the first conduction type substrate 20.

A second conduction type impurity 71 is implanted in the first conduction type substrate 20 exposed from the gate electrode 30 and the sidewall 90 to form a source/drain diffusion layer 80.

According to the above process steps, each individual semiconductor device (semiconductor element) 10 is completed.

Further, as shown in FIGS. 15(A) and 15(B), a first insulating film 310 is formed which covers the exposed whole surface, i.e., the front surface 20a of the P type silicon substrate 20, the device isolation films 25, the sidewall 90 and the gate electrode 30. The first insulating film 310 is of a so-called interlayer insulating film. Thus, this process step may be defined as a step for forming a silicon oxide film by, for example, a CVD method, which is performed on an arbitrary and suitable condition.

Next, contact holes comprising first S/D contact holes 411 and a first gate contract hole 421 are defined in the first insulating film 310 by the photolithography and etching process steps known to date.

Each of the first S/D contact holes 411 is formed as a contact hole that reaches the source/drain diffusion layer 80 and exposes its surface. The first gate contract hole 421 is formed as a contact hole that extends through the first insulating film 310 and thereby exposes the surface 34a of the gate polysilicon layer 34.

Next, embedded contacts are formed by burying these contact holes with a conductive material, preferably, for example, tungsten (W) or the like.

That is, the first S/D contact holes 411 are buried to form first S/D embedded contacts 410a electrically connected to the source/drain diffusion layer 80. The first gate contact hole 421 is buried to form a first gate embedded contact 420a electrically connected to the gate polysilicon layer 34. The first S/D embedded contacts 410a and the first gate embedded contact 420a are formed so as to be substantially approximately identical in height to a surface 310a of the first insulating film 310.

Next, first bit lines 202 are formed as shown in FIG. 15(A).

The first bit lines 202 extend over the surface 310a of the first insulating film 310 and are electrically connected to the first S/D embedded contacts 410a. That is, the first bit lines 202 are formed in contact with top faces 410aa of the first S/D embedded contacts 410a respectively.

Next, a second insulating film 320 corresponding to an interlayer insulating film that covers the first bit lines 202, the first insulating film 310, the first S/D embedded contacts 410a and the first gate embedded contact 420a is formed.

Next, second S/D contact holes 412 for exposing the top faces 410aa of the first S/D embedded contacts 410a and a second gate contact hole 422 for exposing a top face 420aa of the first gate embedded contact 420a, both of which extend through the second insulating film 320, are formed by the photolithography and etching process steps known to date.

Next, embedded contacts are formed by burying these contact holes with a conductive material, preferably, for example, tungsten (W) or the like.

That is, the second S/D contact holes 412 are buried to form second S/D embedded contacts 410b electrically connected to the first S/D embedded contacts 410a. The second gate contact hole 422 is buried to form a second gate embedded contact 420b electrically connected to the first gate embedded contact 420a. The second S/D embedded contacts 410b and the second gate embedded contact 420b are formed so as to be substantially approximately identical in height to a surface 320a of the second insulating film 320.

Next, second bit lines 204 are formed.

The second bit lines 204 extend over the surface 320a of the second insulating film 320 and are electrically connected to their corresponding second S/D embedded contacts 410b. That is, the second bit lines 204 are formed in contact with their corresponding top faces 410ba of the second S/D embedded contacts 410b.

The second bit lines 204 may preferably be formed by patterning in accordance with the method known per se in the art, using a conductive material like, for example, tungsten or tungsten silicide.

Next, a third insulating film 330 corresponding to an interlayer insulating film that covers the second bit lines 204 is formed. This process step may be defined as a step for forming a silicon oxide film by, for example, the CVD method, which is performed on an arbitrary and suitable condition.

A description will further be made in association with FIG. 4(A). A plurality of first bit lines 202 are electrically connected to their corresponding source/drain diffusion layers 80 held in contact with a first implantation region 24a in one cell area 200 of a plurality of cell areas 200 arranged in matrix form and a second implantation region 24b in the other cell area 200 thereof. A plurality of second bit lines 204 are electrically independent of the first bit lines 202 and electrically connected to their corresponding source/drain diffusion layers 80 held in contact with a third implantation region 24c in one cell area 200 and a fourth implantation region 24d in the other cell area 200.

Next, a third gate contact hole 423, which extends through the third insulating film 330 and exposes a top face 420ba of the second gate embedded contact 420b, is formed by the photolithography and etching process steps known to date.

Next, embedded contacts are formed by burying these contact holes with a conductive material, preferably, for example, tungsten (W) or the like.

That is, the third gate contact hole 423 is buried to form a third gate embedded contact 420c electrically connected to its corresponding second gate embedded contact 420b. The third gate embedded contact 420c is formed so as to be substantially approximately identical in height to the surface 330a of the third insulating film 330.

Word lines 210 are next formed.

Each of the word lines 210 extends over the surface 330a of the third insulating film 330 and is electrically connected to the third gate embedded contact 420c. That is, the word line 210 is formed in contact with its corresponding top face 420ca of the third gate embedded contact 420c.

The word lines 210 may preferably be formed by patterning in accordance with the method known per se in the art, using a conductive material like, for example, tungsten or tungsten silicide.

Since the combined size of the gate electrode 30 and the sidewall 90 is brought to the patternable minimum size if the above components are formed in the above-described manner, the gate length can be made shorter (smaller) where the same manufacturing device (exposure device) is used.

Third Preferred Embodiment (Configuration Example 3 of Semiconductor Device)

A configuration example of a semiconductor device of the present invention will be explained with reference to FIGS. 16, 17, 18 and 19. Incidentally, the semiconductor device of the present example features the configuration of a bit line as compared with the configuration of the first embodiment. Since element constitutions other than the bit lines are nearly similar to the first embodiment, the same constitutions are given the same reference numerals and their detailed explanation are hence omitted.

Figure 16:
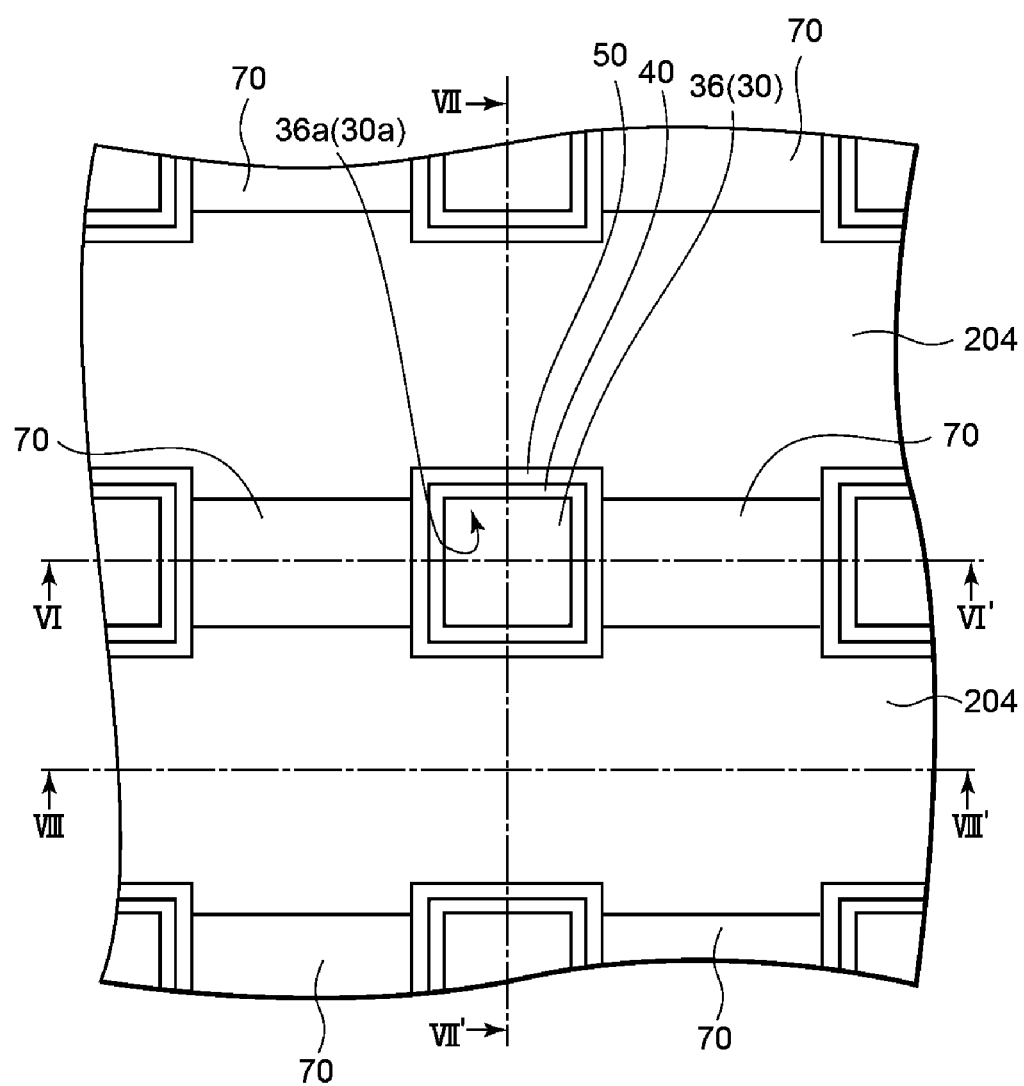
FIG. 16 is a plan typical view of the semiconductor device as viewed from the side of its upper surface.

FIG. 16 is a plan typical view of the semiconductor device as viewed from its upper surface side.

Figure 17A:
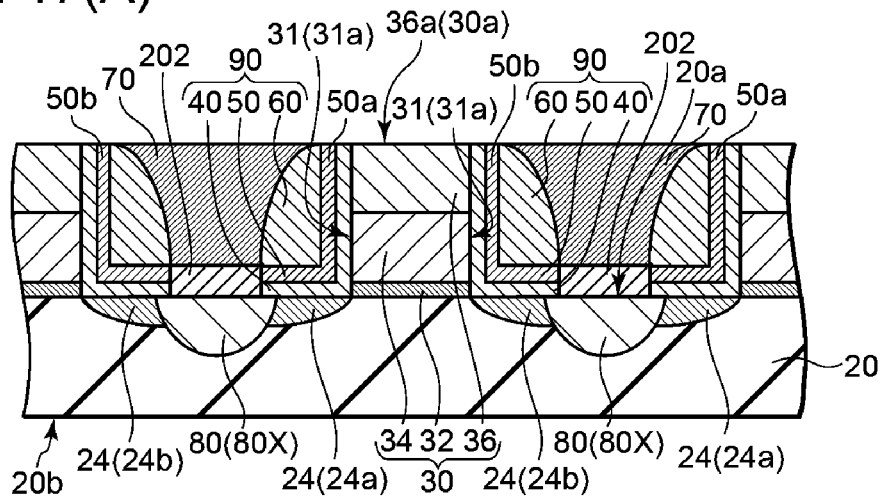
FIGS. 17(A), 17(B) and 17(C) are respectively typical views respectively illustrating cut cross-sections cut along one-dot chain line VI-VI' of FIG. 16, one-dot chain line VII-VII' thereof and one-dot chain line VIII-VIII' thereof.
Figure 17B:
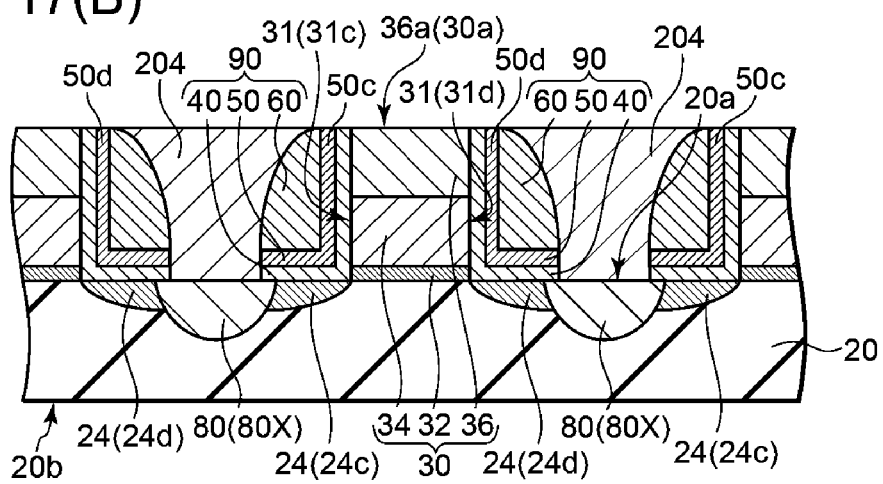

FIGS. 17(A) and 17(B) are respectively typical views respectively showing cut cross-sections cut along one-dot chain line VI-VI' shown in FIG. 16, one-dot chain line VII-VII' thereof and one-dot chain line VIII-VIII' thereof.

Figure 18:
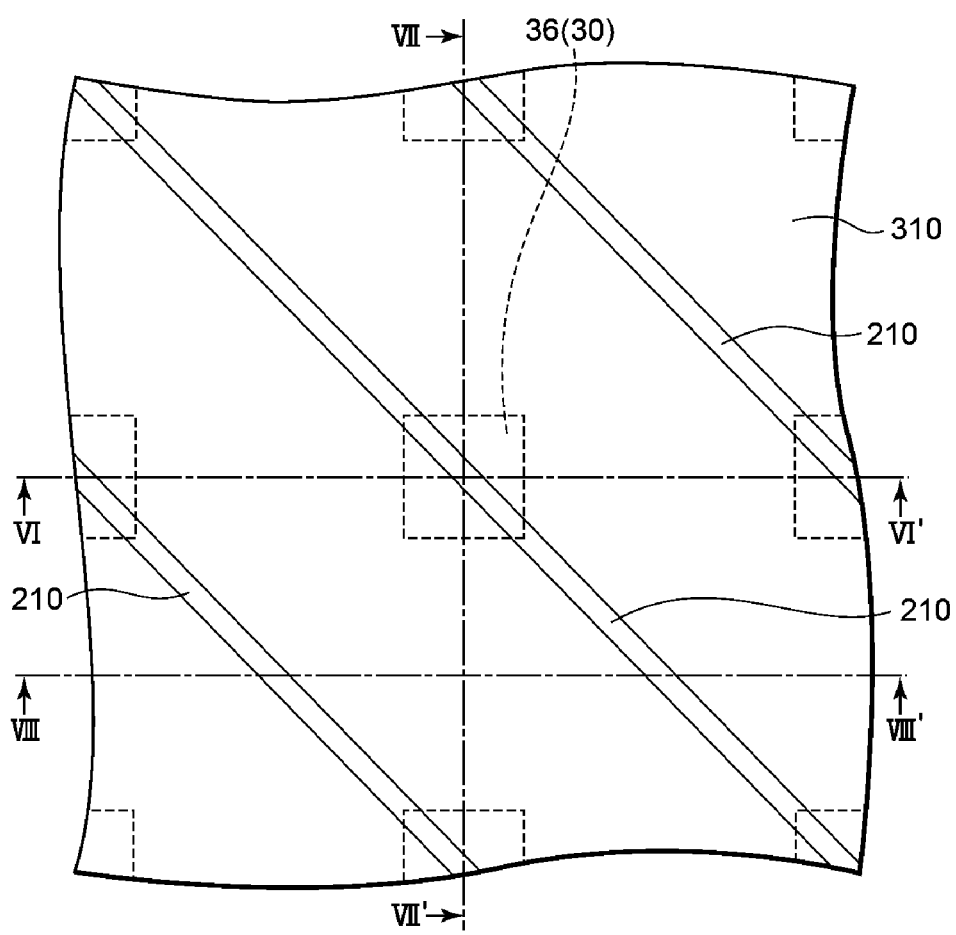
FIG. 18 is a plan typical view of the semiconductor device provided with word lines, as seen from the side of its upper surface.

FIG. 18 is a plan typical view of the semiconductor device provided with word lines as viewed from its upper surface side.

FIGS. 19(A) and 19(B) are respectively typical views respectively showing cut cross-sections cut along one-dot chain line VI-VI' shown in FIG. 16, one-dot chain line VII-VII' thereof and one-dot chain line VIII-VIII' thereof.

As shown in FIGS. 16 and 17, the semiconductor device 10 has a gate electrode 30 shaped in the form of an approximately quadrangular prism like, for example, a rectangular parallelepiped or a cube. The gate electrode 30 is provided on a front surface 20a of a first conduction type substrate 20.

The gate electrode 30 includes a gate oxide layer 32. The gate oxide layer 32 is provided in contact with the front surface 20a.

A gate polysilicon layer 34 is provided with being laminated on the gate oxide layer 32. A gate silicon nitride layer 36 is provided with being laminated on the gate polysilicon layer 34.

The semiconductor element 10 is provided with a second conduction type implantation region 24. The second conduction type implantation region 24 is provided in a partial area of the first conduction type substrate 20.

The second conduction type implantation region 24 is provided in a region including a region placed outside the gate electrode 30, i.e., a region directly below a sidewall 90 by an impurity implanted in a region located outside the end edges (side surface 31) of the gate electrode 30.

The semiconductor element 10 has the sidewall 90. That is, the gate electrode 30 has the side surface 31 covered with the sidewall 90. A top face 30a of the gate electrode 30 is exposed from the sidewall 90.

A sidewall mask oxide layer 40, an electron storage nitride layer 50 and a sidewall silicon oxide layer 60 are contained in the sidewall 90 with being laminated on one another.

As shown in FIG. 4(B), the semiconductor device of the present example also includes a first partial region 50a opposite to a first side surface 31a of the gate electrode 30, a second partial region 50b opposite to a second side surface 31b, a third partial region 50c opposite to a third side surface 31c and a fourth partial region 50d opposite to a fourth side surface 31d.

The sidewall silicon oxide layer 60 is provided so as to cover over the partial region corresponding to the part above the side surface 31, of the electron storage nitride layer 50 and the partial region corresponding to the part above the second conduction type implantation region 24, of the electron storage nitride layer 50.

The semiconductor element 10 is equipped with a source/drain diffusion layer 80. The source/drain diffusion layer 80 is provided in a partial area of the first conduction type substrate 20, which is exposed from the gate electrode 30 and the sidewall 90.

The semiconductor element 10 having the above configuration constitutes, for example, a memory cell with its plural being configured in matrix array form.

Described specifically, a plurality of rectangular cell areas 200 are set onto the front surface 20a of the first conduction type substrate 20 in matrix form.

As shown in FIG. 4(A), the semiconductor device 10 has a plurality of first bit lines 202 and a plurality of second bit lines 204.

In the present example, each of the first bit lines 202 is located between the third partial region 50c and the fourth partial region 50d of the adjoining cell area 200. Each of the second bit lines 204 is located between the first partial region 50a and the second partial region 50b of the adjoining cell area 200. The first bit lines 202 and the second bit lines 204 extend in the direction in which they exit along the boundary between the two cell areas 200 adjacent to each other. That is, if seen on the plan basis even in the present example, then the first bit lines 202 extend in upward and downward directions as viewed in the drawing, and the second bit lines 204 extend in the directions orthogonal to the first bit lines 202, i.e., the horizontal direction as viewed in the drawing, in a manner similar to the first embodiment.

As shown in FIG. 17(A), each of the first bit lines 202 is located between the gate electrodes 30 of the cell areas 200 adjacent to each other and between the adjacent sidewalls 90.

The first bit lines 202 are electrically connected to the source/drain diffusion layers 80 held in contact with a first implantation region 24a in one cell area 200 of the two adjoining cell areas 200 and a second implantation region 24b in the other cell area 200, while being held in contact with the source/drain diffusion layers 80.

The first bit lines 202 are provided outside both of the adjacent two sidewalls 90 in contact therewith. That is, the first bit lines 202 are provided so as to bury between the adjacent two sidewalls 90 on a self-alignment basis.

Each of the first bit lines 202 is provided as a height lower than the height of the sidewall 90.

Figure 17C:
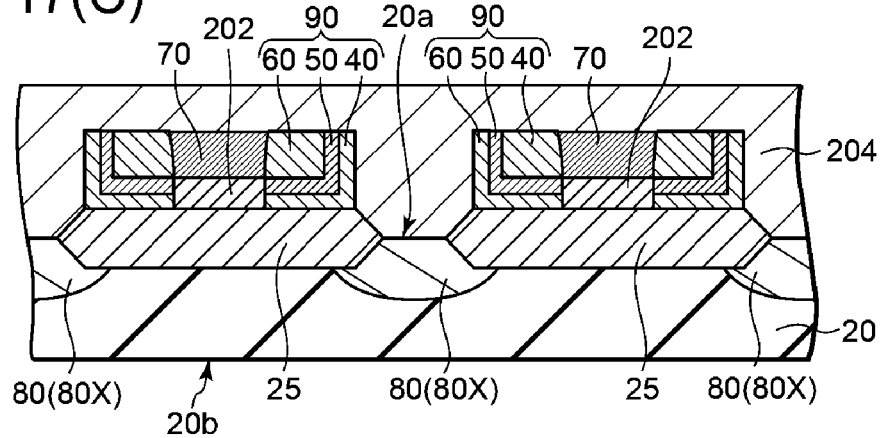

As shown in FIG. 17(C), the first bit lines 202 are provided so as not to be in contact with or electrically connected to the source/drain diffusion layers 80 held in contact with and electrically connected to a third implantation region 24c (not shown) in one cell area 200 and a fourth implantation region 24d (not shown) in the other cell area 200.

As shown in FIGS. 17(A) and 17(C), the first bit lines 202 are electrically insulated from the source/drain diffusion layers 80 embedded by an embedded insulting film 70 and electrically connected to the second bit lines 204, the third implantations region 24c and the fourth implantation region 24d to be described later.

The embedded insulating film 70 is provided so as to bury the outside of each sidewall 90 up to a height substantially equal to that of the sidewall 90.

The embedded insulating film 70 is not formed in a region in which each first bit line 202 does not exist, for example, a region between the cell areas 200, in which each second bit line (204) to be described later exists.

As shown in FIG. 17(B), the second bit lines 204 are electrically connected to their corresponding source/drain diffusion layers 80 held in contact with a third implantation region 24c in one cell area 200 of the two adjacent cell areas 200 and a fourth implantation region 24d of the other cell area 200 thereof while being in contact with the source/drain diffusion layers 80.

The second bit lines 204 are provided in contact with both outer sides of the adjacent two sidewalls 90. That is, the second bit lines 204 are provided so as to bury between the adjacent two sidewalls 90 on a self-alignment basis in regions in which the sidewalls 90 exist. Each of the second bit lines 204 can be provided as a height substantially equal to that of the sidewall 90 in the region in which the sidewall 90 exists.

As shown in FIG. 17(C), the second bit lines 204 extend in a state in which they straddle the first bit lines 202 and are insulated from the first bit lines 202 by the embedded insulating film 70.

As shown in FIGS. 18 and 19, the semiconductor device 10 includes a plurality of word lines 210. The word lines 210 extend in the diagonal directions of the rectangular cell areas 200 and are provided astride the plurality of cell areas 200. The word lines 210 are electrically connected to their corresponding gate electrodes 30 of the plurality of cell areas 200 over which they extend astride.

According to the configuration of the semiconductor device of the present example, the first and second bit lines 202 and 204 can be provided on a self-alignment basis with respect to the outer shapes of the sidewalls 90. Thus, it is possible to make smaller the cell size of each transistor (semiconductor element) and enhance the degree of integration.

(Example 3 of Semiconductor Device Manufacturing Method)

An example of a method for manufacturing a semiconductor device of the present example will be explained with reference to FIGS. 20, 21, 22, 23, 24 and 25.

Incidentally, since constitutions marked with the same reference numerals as those in the already-described first embodiment can be formed similarly in the manufacturing process of the present example, their detailed explanations are omitted in principle. However, they might be explained by suitably referring to the drawings used in the description of other embodiments.

Figure 20A:
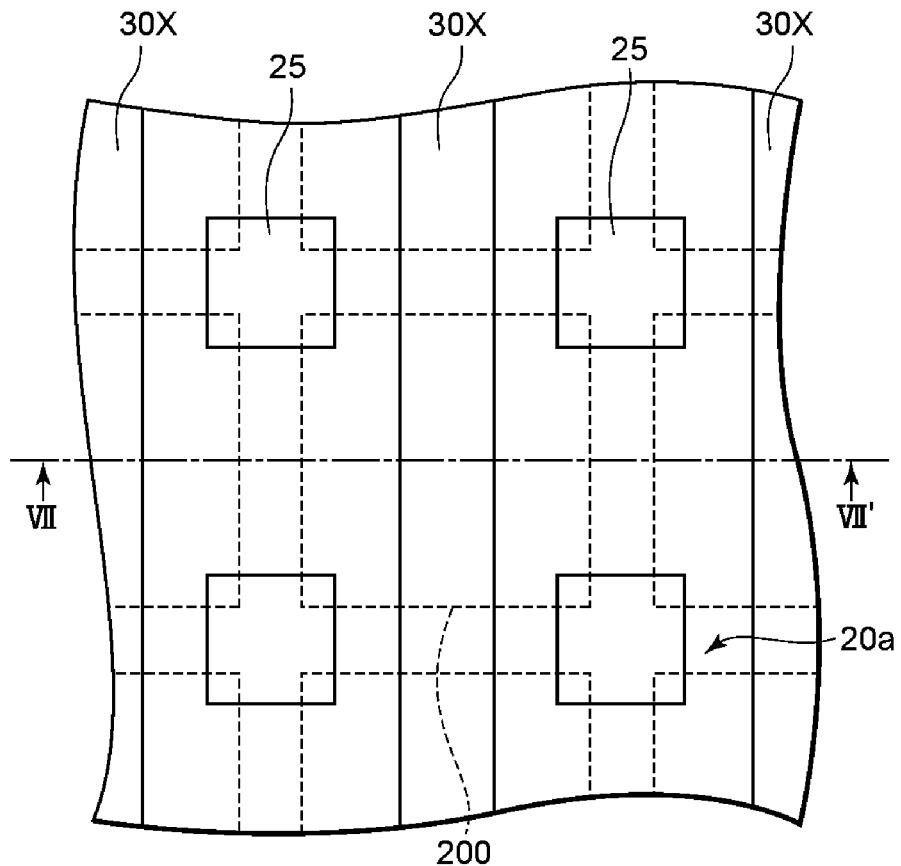
Figure 20B:
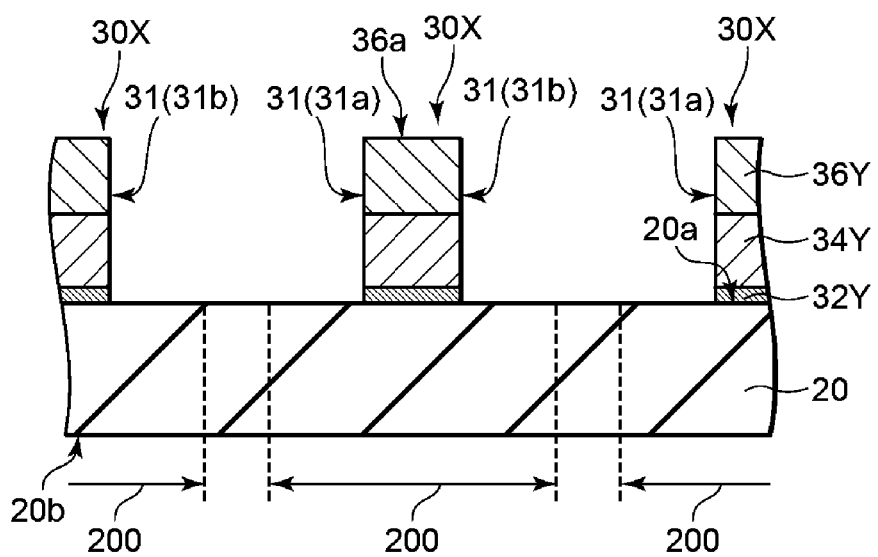

FIGS. 20(A) and 20(B) are respectively typical manufacturing process views for describing a process for manufacturing the semiconductor device of the present invention. FIG. 20(A) is a plan schematic view of the semiconductor device, and FIG. 20(B) is a schematic view showing a cut cross-section cut along one-dot chain line VII-VII' of FIG. 20(A).

Figure 21A:
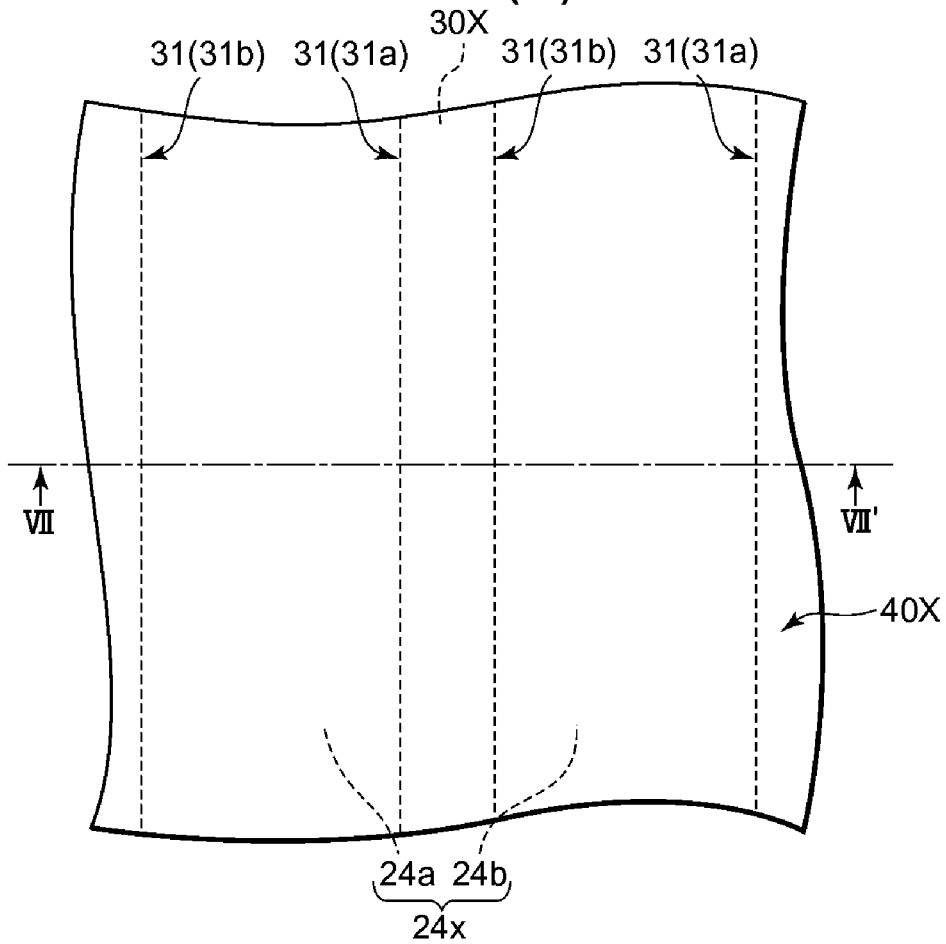
FIGS. 21(A) and 21(B) are respectively typical manufacturing process views following FIG. 20, for describing a process for manufacturing the semiconductor device of the present invention.
Figure 21B:
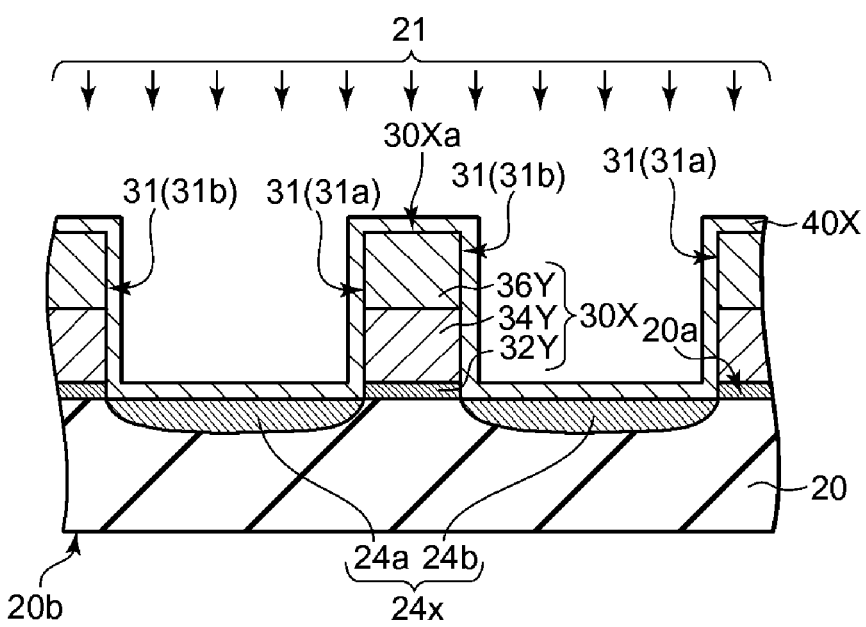

FIGS. 21(A) and 21(B) are respectively typical manufacturing process views following FIG. 20, for describing the process for manufacturing the semiconductor device of the present invention.

Figure 22A:
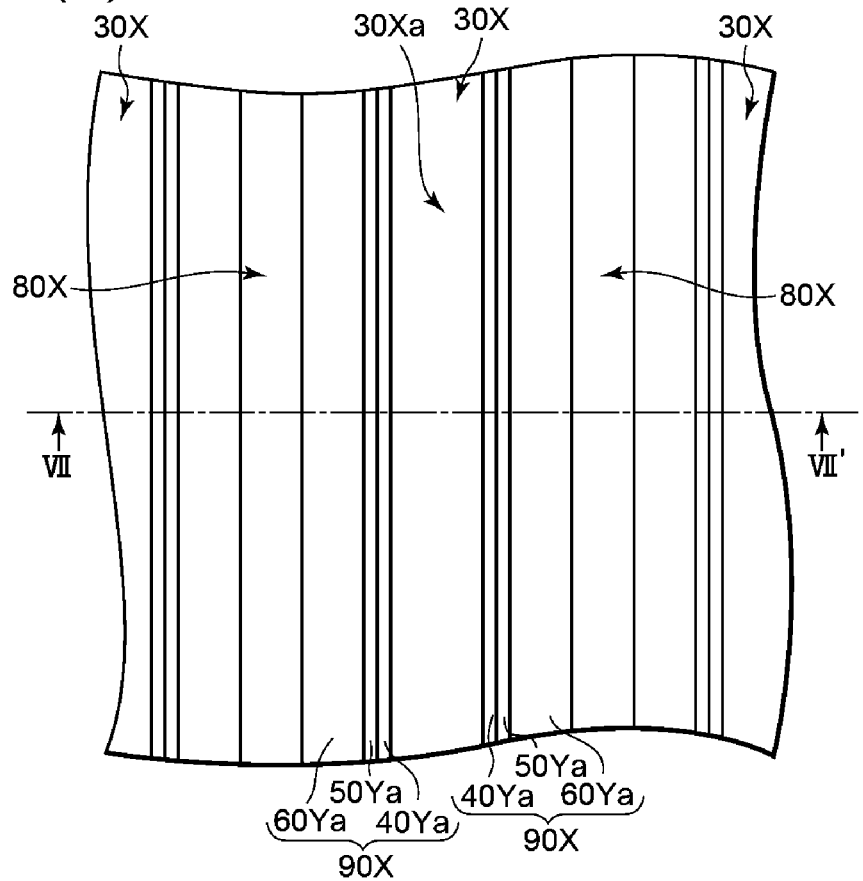
FIGS. 22(A) and 22(B) are respectively typical manufacturing process views following FIG. 21, for describing the process for manufacturing the semiconductor device of the present invention.
Figure 22B:
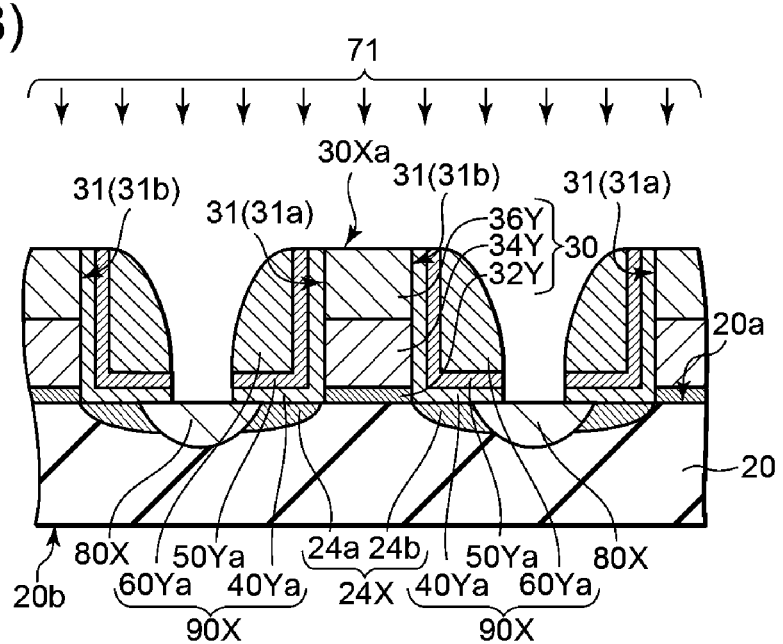

FIGS. 22(A) and 22(B) are respectively typical manufacturing process views following FIG. 21, for describing the process for manufacturing the semiconductor device of the present invention.

Figure 23A:
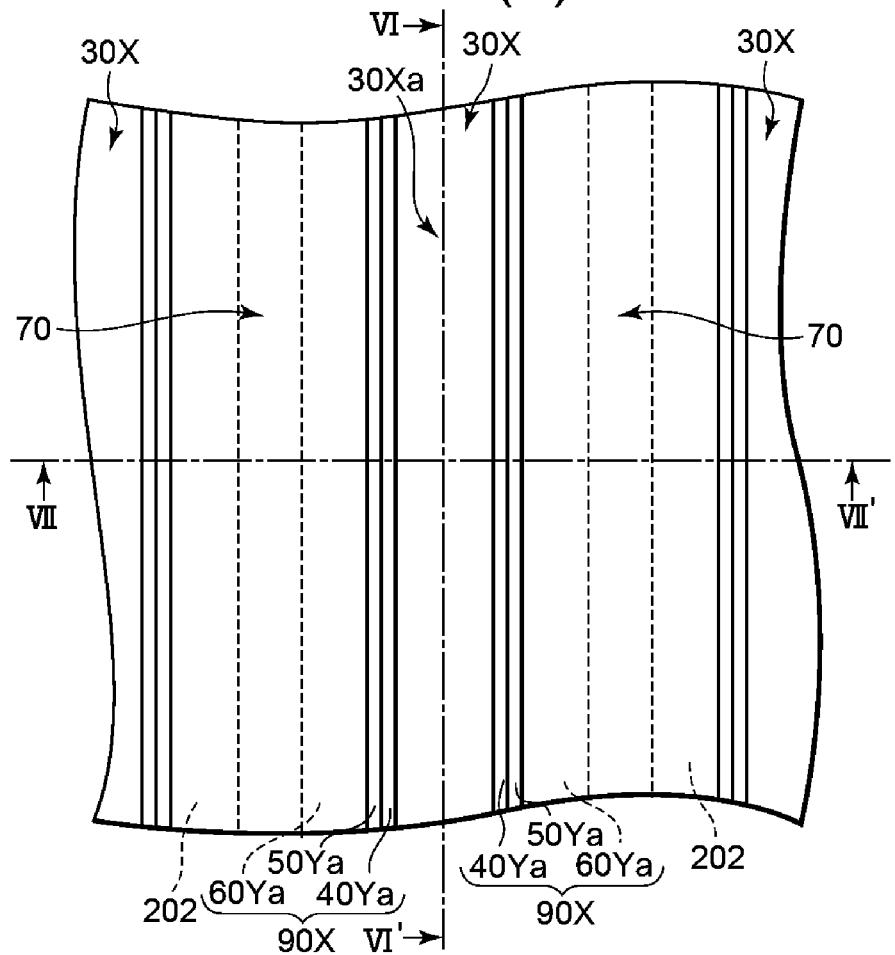
FIGS. 23(A) and 23(B) are respectively typical manufacturing process views following FIG. 22, for describing the process for manufacturing the semiconductor device of the present invention.
Figure 23B:
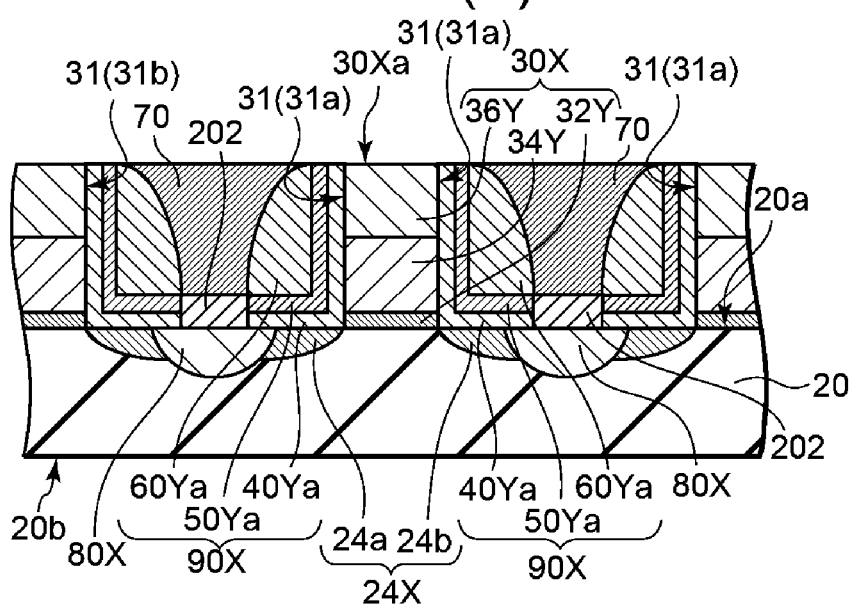

FIGS. 23(A) and 23(B) are respectively typical manufacturing process views following FIG. 22, for describing the process for manufacturing the semiconductor device of the present invention.

Figure 24A:
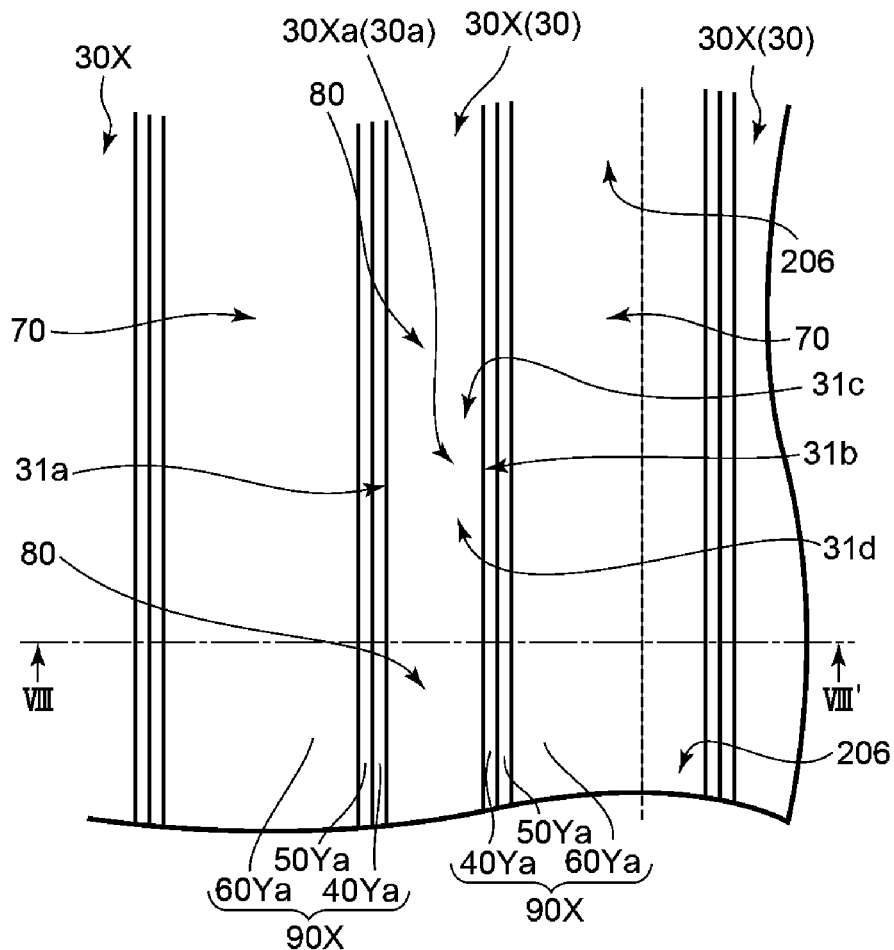
FIGS. 24(A) and 24(B) are respectively typical manufacturing process views following FIG. 23, for describing the process for manufacturing the semiconductor device of the present invention.
Figure 24B:
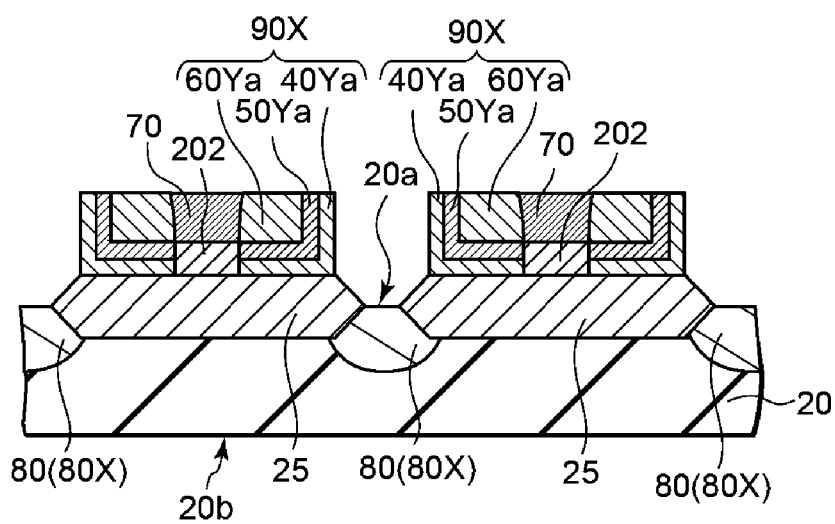

FIGS. 24(A) and 24(B) are respectively typical manufacturing process views following FIG. 23, for describing the process for manufacturing the semiconductor device of the present invention.

Figure 25A:
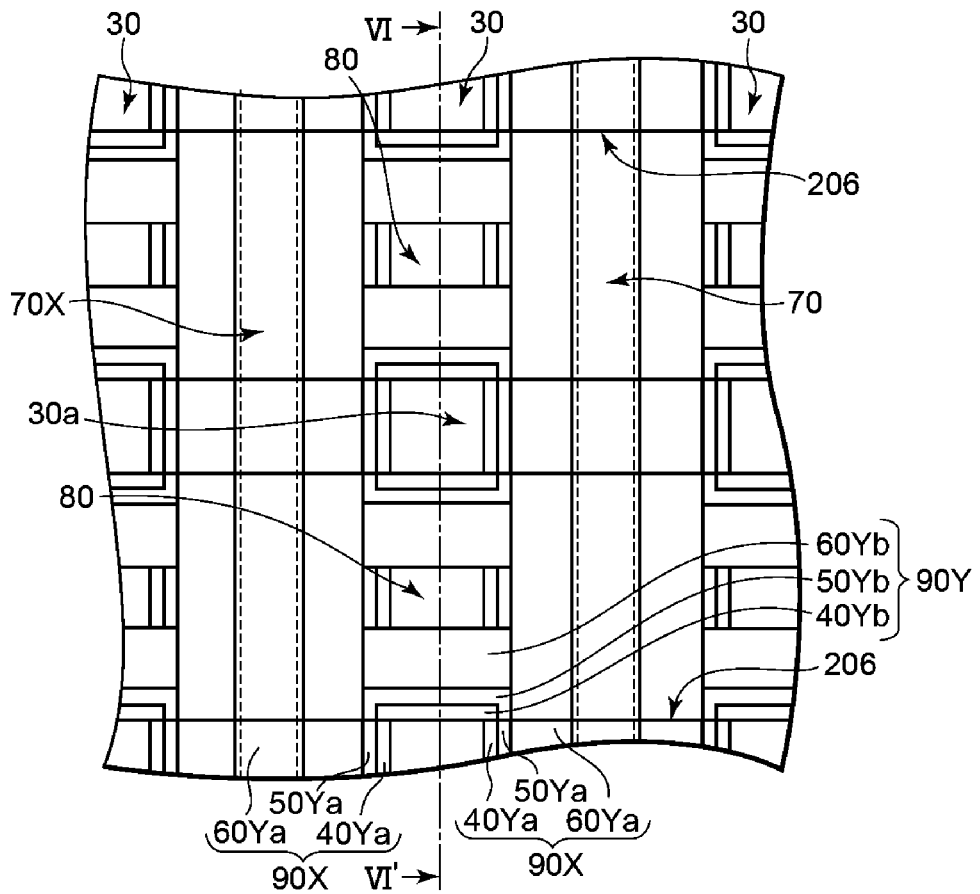
FIGS. 25(A) and 25(B) are respectively typical manufacturing process views following FIG. 24, for describing the process for manufacturing the semiconductor device of the present invention.
Figure 25B:
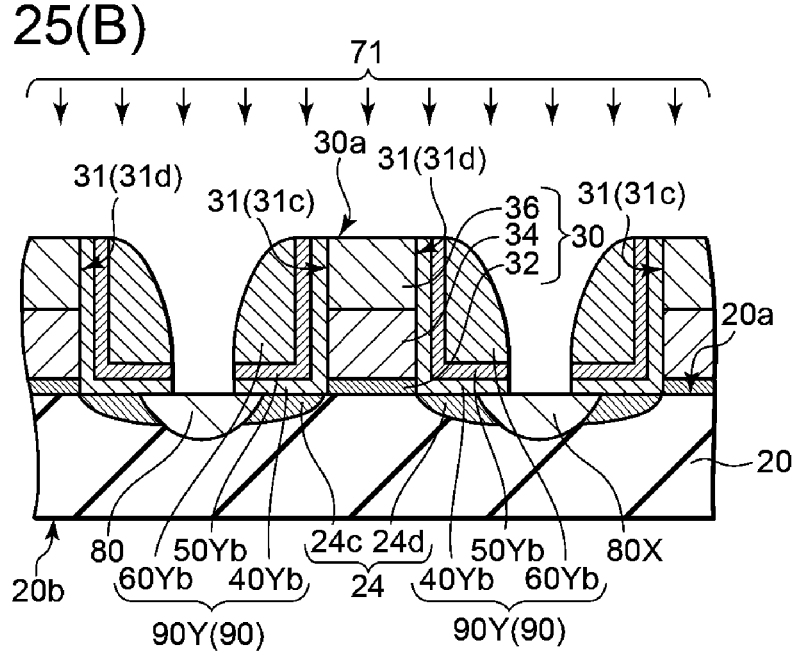
Figure 26:
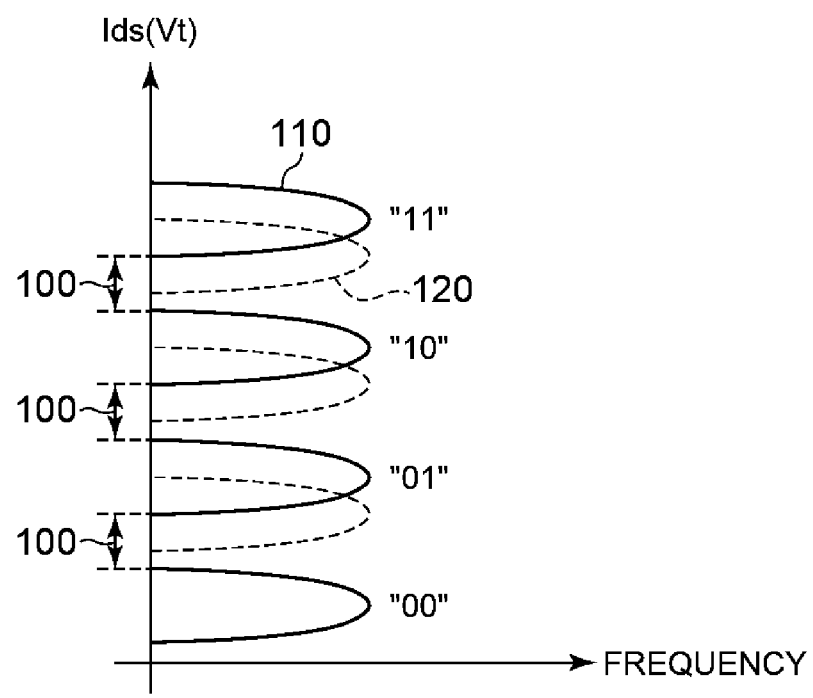
FIG. 26 is an explanatory view of a related art.

FIGS. 25(A) and 25(B) are respectively typical manufacturing process views following FIG. 24, for describing the process for manufacturing the semiconductor device of the present invention.

As shown in FIG. 5(A) already described above, a P type substrate is first prepared as a first conduction type substrate 20. The first conduction type substrate 20 has a front surface 20a and a back surface 20b opposite to the front surface 20a.

Element isolation films 25 are formed on the front surface 20a side of the P type substrate, and a plurality of cell areas 200 separated from one another by the element isolation films 25 are set in matrix form.

Next, as shown in FIG. 5(C), a gate oxide film 32X is formed on the exposed front surface 20a of P type substrate.

Next, a gate polysilicon film 34X is formed on the gate oxide film 32X.

Further, a gate silicon nitride film 36X is formed on the gate polysilicon film 34X.

Next, a resist mask is formed on the gate silicon nitride film 36X in accordance with the method known per se in the art (not shown).

Then, the gate oxide film 32X, the gate polysilicon film 34X and the gate silicon nitride film 36X are patterned using the resist mask to form precursor gate electrodes 30X as shown in FIGS. 20(A) and 20(B).

Each of the precursor gate electrodes 30X is formed as a laminated body of a precursor gate oxide layer 32Y provided on the front surface 20a of the first conduction type substrate 20, a precursor gate polysilicon layer 34Y provided on the precursor gate oxide layer 32Y and a precursor gate silicon nitride layer 36Y provided on the precursor gate polysilicon layer 34Y.

The precursor gate electrode 30X is formed so as to have a first side surface 31a and a second side surface 31b opposite in parallel with the first side surface 31a to each other.

The precursor gate electrode 30X has a shape defined in the form of a bar having a rectangular top face. The precursor gate electrodes 30X extend in stripe form in such a manner that their widths fall within the cell areas 200 and they are placed linearly in the direction along the sides constituting the rectangles of the cell areas 200, in the present example, the vertical direction as viewed in the drawing, and a plurality of the precursor gate electrodes are placed in parallel with respect to one another.

As shown in FIGS. 21(A) and 21(B), a sidewall mask oxide film 40X is formed which covers the entire surface of the exposed first conduction type substrate 20 and the whole surfaces of the precursor gate electrodes 30X.

Using the precursor gate electrodes 30X as masks, a second conduction type impurity 21 is implanted in the first conduction type substrate 20 to form precursor second conduction type implantation regions 24X each including a first implantation region 24a provided in junction with the first side surface 31a and a second implantation region 24b provided in junction with the second side surface 31b.

Next, an electron storage nitride film (50X) is formed on the sidewall mask oxide film 40X in a manner similar to the already-described first embodiment (not shown).

A sidewall silicon oxide film (60X) is formed on the electron storage nitride film (not shown).

Further, as shown in FIGS. 22(A) and 22(B), the sidewall mask oxide film 40X, the electron storage nitride film (50X) and the sidewall silicon oxide film (60X) are partly removed respectively.

According to this process step, first sidewalls 90X are formed each of which exposes a top faces 30Xa of the precursor gate electrode 30X and is formed by laminating a first sidewall mask oxide layer 40Ya, a first electron storage nitride layer 50Ya and a first sidewall silicon oxide layer 60Ya which reach parts of the first conduction type substrate 20 and cover the entire first side surface 31a and the entire second side surface 31b.

A second conduction type impurity 71 is implanted in the first conduction type substrate 20 exposed from the precursor gate electrodes 30X and the first sidewalls 90X to form precursor source/drain diffusion layers 80X.

That is, the precursor source/drain diffusion layers 80X are formed in junction with the first sidewalls 90X each covering the first side surface 31a and the second side surface 31b along the direction in which the precursor gate electrodes 30X extend.

Next, as shown in FIGS. 23(A) and 23(B) and FIG. 17 already described above, first bit lines 202 are formed by a wiring forming process step known to date executed on an arbitrary and suitable condition, using an arbitrary and suitable wiring material, preferably, a conductive material like, for example, tungsten or tungsten silicide.

The first bit lines 202 are formed so as to extend in the direction along the extending direction of the precursor gate electrodes 30X.

As described above, each of the first bit lines 202 is formed with being electrically connected to a precursor source/drain diffusion layer 80X placed between the precursor gate electrodes 30X, i.e., between the outer sides of the first sidewalls 90X covering the adjoining different precursor gate electrodes 30X and held in contact with the first implantation region 24a in one cell area 200 and the second implantation region 24b in the other cell area 200.

The first bit lines 202 are formed so as not to be in contact with or electrically connected to the source/drain diffusion layers 80 held in contact with and electrically connected to a third implantation region 24c in one cell area 200 and a fourth implantation region 24d in the other cell area 200.

At this time, each of the first bit lines 202 is set as a height lower than that of the first sidewall 90X and formed so as to bury between the adjacent first sidewalls 90X.

Each embedded insulating film 70 is provided so as to bury the outside of each first sidewall 90X up to a height substantially equal to that of the first sidewall 90X.

The embedded insulating film 70 is not formed in a region in which each first bit line 202 does not exist.

As shown in FIGS. 24(A) and 24(B), trenches 206 for patterning the precursor gate electrodes 30X into a plurality of island shapes by the photolithography and etching process steps known to date, whereby the precursor gate electrodes 30X are completed as gate electrodes 30 shaped in the form of an approximately quadrangular prism.

The trenches 206 are formed astride the plurality of precursor gate electrodes 30X. That is, in the present example, they are formed in the direction orthogonal to the direction in which the plurality of precursor gate electrodes 30X extend.

That is, the top faces 30Xa of the precursor gate electrodes 30X are divided and completed as top faces 30a of a plurality of gate electrodes 30 identical in area thereto by the present step.

A third side surface 31c, which is located between the first side surface 31a and the second side surface 31b and provided in junction with the first side surface 31a and the second side surface 31b, and a fourth side surface 31d, which is opposite to the third side surface 31c and located between the first side surface 31a and the second side surface 31b and which is provided in continuous connection with the first side surface 31a and the second side surface 31d, both of which being in junction with the sides of each top face 30a, are formed in addition to the first side surface 31a and the second side surface 31b.

At this time, the third side surface 31c and the four side surface 31d exposed from the trenches 206 extend to the front surface 20a of the first conduction type substrate 20, that is, they completely partition a laminated body of the precursor gate oxide layer 32Y, the precursor gate polysilicon layer 34Y and the precursor gate silicon nitride layer 36Y. However, the parts of the first sidewalls 90X, the entire first bit line 202 that buries space defined between these, and the part of each embedded insulating film 70 are patterned so as to remain.

This patterning step is performed in such a manner that each trench 206 does not expose the first bit line 202, that is, the first bit line 202 is maintained in its entire form, and is performed in such a manner that the embedded insulating film 70 remains, that is, the heights of the first sidewall 90X and the embedded insulating film 70 become lower than the heights of the first sidewall 90X and the embedded insulating film 70 of each cell area 200.

According to this patterning step, a plurality of gate electrodes 30, each of which includes a gate oxide layer 32, a gate polysilicon layer 34 provided on the gate oxide layer 32, and a gate silicon nitride layer 36 provided on the gate polysilicon layer 34 and in which a first side surface 31a, a second side surface 31b, a third side surface 31c and a fourth side surface 31d are respectively made opposite to the sides defining each rectangular cell area 200, are respectively formed within a plurality of the cell areas 200.

As shown in FIGS. 25(A) and 25(B), second sidewalls 90Y are then formed in these exposed third side surface 31c and fourth side surface 31d.

Upon forming the second sidewalls 90Y, a second sidewall mask oxide layer (film) 40Yb is first formed in each trench 206.

Next, a second conduction type impurity is implanted in the first conduction type substrate 20 using each formed gate electrode 30 as a mask to form a third implantation region 24c held in junction with its corresponding third side surface 31c and a fourth implantation region 24d held in continuous connection with its corresponding fourth side surface 31d by a process step similar to the ion implantation step already described in another embodiment referred to above, in addition to the already-formed first implantation region 24a and second implantation region 24b, whereby each precursor second conduction type implantation region 24X is completed as a second conduction type implantation region 24.

Further, a second electron storage nitride layer (film) 50Yb is formed on its corresponding second sidewall mask oxide layer 40Yb.

Next, a second sidewall silicon oxide layer (film) 60Yb is formed on the second electron storage nitride layer 50Yb.

The second sidewall mask oxide film 40Yb, the second electron storage nitride film 50Yb and the second sidewall silicon oxide film 60Yb are partly removed respectively to form a second sidewall 90Y.

The second sidewall 90Y has a configuration similar to the first sidewall 90X and exposes the top face 30a of each gate electrode 30.

The second sidewall 90Y extends to part of the first conduction type substrate 20 and covers the third side surface 31c and the fourth side surface 31d.

The second sidewall 90Y is formed by laminating a second sidewall mask oxide layer 40Yb held injunction with its corresponding first sidewall mask oxide layer 40Yb, a second electron storage nitride layer 50Yb held injunction with its corresponding first electron storage nitride layer 50Yb, and a second sidewall silicon oxide layer 60Yb held in junction with its corresponding first sidewall silicon oxide layer 60Ya.

At this time, the second electron storage nitride layer 50Yb has a third partial region 50c opposite to the third side surface 31c and a fourth partial region 50d opposite to the fourth side surface 31d, both of which are held in continuous connection with a first partial region 50a and a second partial region 50b.

Combined with the first sidewalls 90X in this way, that is, the first and second sidewalls 90X and 90Y are so combined as to be completed as a sidewall 90.

Next, a second conduction type impurity 71 is implanted in the first conduction type substrate 20 which is exposed from the completed gate electrodes 30 and sidewalls 90 and placed between the third side surface 31c of one gate electrode 30 and the fourth side surface 31d of the other gate electrode 30, both being opposite to each other with the boundary between the cell areas 200 interposed therebetween, thereby to complete the precursor source/drain diffusion layers 80X as source/drain diffusion layers 80.

Further, a plurality of second bit lines 204 are formed in areas of the first conduction type substrate 20 in which the formed source/drain diffusion layers 80 are formed, i.e., areas or regions located between the third and fourth side surfaces 31c and 31d opposite to one another with the boundary between the cell areas 200 being interposed therebetween by a material similar to the first bit lines 202 and a process step similar thereto. Incidentally, the second bit line 204 may preferably be formed as a height substantially equal to that of the sidewall 90 (refer to FIG. 16 and FIG. 17(B)).

The second bit lines 204 are formed directly above the exposed source/drain diffusion layers 80 with being electrically connected thereto. The source/drain diffusion layer 80 is a diffusion layer brought into contact with the third implantation region 24c of one cell area 200 and the fourth implantation region 24d of the other cell area 200.

The second bit lines 204 are caused to extend in the direction different from that for the already-formed first bit lines 202, i.e., the orthogonal direction in the present example, and formed electrically independent of the first bit lines 202.

The second bit lines 204 are caused to extend over the sidewall 90 and the embedded insulting film 70 whose heights at which they cover the first bit lines 202, are lowered at portions where the second bit lines 204 intersect the first bit lines 202 respectively (refer to FIGS. 16 and 17(C)).

Thus, the second bit lines 204 can be formed over the source/drain diffusion layers 80 each exposed in a valley defined by the sidewalls 90 on a self-alignment basis.

Accordingly, the planar area per unit corresponding to one semiconductor element manufactured inclusive of the bit lines can be made smaller. Thus, the degree of integration of each semiconductor element can be more enhanced.

As shown in FIGS. 18 and 19 already explained above, a first insulating film 310 is next formed which covers the exposed entire surface, i.e., the front surface 20a of the substrate 20, the element isolation films 25 and the second bit lines 204, the sidewalls 90 and the gate electrodes 30.

Next, first gate contact holes 421 are defined in the first insulating film 310.

The first gate contact holes 421 are formed as contact holes each of which extends through the first insulating film 310 and the gate silicon nitride layer 36 of the gate electrode 30 and exposes the surface of the gate polysilicon layer 34.

Next, embedded contacts are formed by burying these contact holes with a conductive material, preferably, for example, tungsten (W) or the like.

That is, the first gate contact holes 421 are buried to form first gate embedded contacts 420a each electrically connected to the gate polysilicon layer 34. The first gate embedded contacts 420a are formed so as to be substantially approximately identical in height to a surface 310a of the first insulating film 310.

Next, word lines 210 are formed.

The word lines 210 extend over the surface 310a of the first insulating film 310 in the diagonal directions of the rectangular cell areas 200 as described above and are electrically connected to their corresponding first gate embedded contacts 420a.

That is, the word lines 210 are formed in contact with their corresponding top faces 420aa of the first gate embedded contacts 420a.

If the semiconductor device is formed by such process steps, then the first and second bit lines 202 and 204 can be formed on a self-alignment basis over the source/drain diffusion layers 80 exposed in valleys each formed by the sidewalls 90.

Accordingly, the planar area per unit corresponding to one semiconductor element manufactured inclusive of the bit lines can be made smaller. Thus, the degree of integration of each semiconductor element can be more enhanced.

As compared with the first and second embodiments, both the first and second bit lines 202 and 204 can be brought within the height of the sidewall 90. It is therefore possible to bring the semiconductor device into thinner form, i.e., to make the size of the semiconductor device smaller as a whole.

While the preferred forms of the present invention have been described, it is to be understood that modifications will be apparent to those skilled in the art without departing from the spirit of the invention. The scope of the invention is to be determined solely by the following claims.

What is claimed is:

1. A semiconductor device comprising:
a first conduction type substrate;
a gate electrode of an approximately quadrangular prism, including a laminated body of a gate oxide layer provided directly on a surface of the first conduction type substrate, a gate polysilicon layer provided directly on the gate oxide layer, and a gate silicon nitride layer provided directly on the gate polysilicon layer, said gate electrode having a rectangular top face, a first side surface, a second side surface opposite to the first side surface, a third side surface located between the first side surface and the second side surface, and a fourth side surface opposite to the third side surface and located between the first side surface and the second side surface;
a second conduction type implantation region provided in the first conduction type substrate including a region located outside the gate electrode, said second conduction type implantation region including a first implantation region provided in junction with the first side surface, a second implantation region provided in junction with the second side surface, a third implantation region provided in junction with the third side surface, and a fourth implantation region provided in junction with the fourth side surface;

a sidewall that exposes the top face of the gate electrode and comprises a sidewall mask oxide layer covering the first side surface, the second side surface, the third side surface and the fourth side surface, an electron storage nitride layer including a first partial region opposite to the first side surface of the gate electrode, a second partial region opposite to the second side surface thereof, a third partial region opposite to the third side surface thereof, and a fourth partial region opposite to the fourth side surface thereof, and a sidewall silicon oxide layer, said sidewall mask oxide layer, said electron storage nitride layer and said sidewall silicon oxide layer being laminated directly on one another; and a source/drain diffusion layer provided in the first conduction type substrate exposed from the gate electrode and the sidewall.

2. A semiconductor device comprising:

a first conduction type substrate;

a plurality of rectangular cell areas set over a surface of the first conduction type substrate in a matrix form;

a plurality of gate electrodes each shaped in the form of an approximately quadrangular prism and including a laminated body of a gate oxide layer provided directly on a respective one of the cell areas, a gate polysilicon layer provided directly on the gate oxide layer and a gate silicon nitride layer provided directly on the gate polysilicon layer, said gate electrodes each having a rectangular top face, a first side surface, a second side surface opposite to the first side surface, a third side surface located between the first side surface and the second side surface, and a fourth side surface opposite to the third side surface and located between the first side surface and the second side surface, said first, second, third and fourth side surfaces being respectively made opposite to sides defining the respective cell area;

second conduction type implantation regions each provided in the first conduction type substrate including a region located outside each of the gate electrodes, said second conduction type implantation regions each including a first implantation region provided in junction with the first side surface, a second implantation region provided in junction with the second side surface, a third implantation region provided in junction with the third side surface, and a fourth implantation region provided in junction with the fourth side surface;

sidewalls each exposing the top face of the gate electrode and covering the first side surface, the second side surface, the third side surface and the fourth side surface, and comprising a sidewall mask oxide layer, an electron storage nitride layer including a first partial region opposite to the first side surface of the gate electrode, a second partial region opposite to the second side surface thereof, a third partial region opposite to the third side surface thereof, and a fourth partial region opposite to the fourth side surface thereof, and a sidewall silicon oxide layer, said sidewall mask oxide layer, said electron storage nitride layer and said sidewall silicon oxide layer being laminated directly on one another;

source/drain diffusion layers each provided in the first conduction type substrate exposed from the gate electrode and the sidewall;

a plurality of first bit lines each extending in a direction along a boundary between two of the cell areas adjacent to each other and being electrically connected to the source/drain diffusion layer brought into contact with the first implantation region in one of the two adjacent cell areas and the second implantation region in the other thereof, and a plurality of second bit lines electrically independent of the first bit lines and each being electrically connected to the source/drain diffusion layer brought into contact with the third implantation region in one of the two adjacent cell areas and the fourth implantation region in the other thereof; and a plurality of word lines extending in diagonal directions of the cell areas and being respectively electrically connected to the gate electrodes of the cell areas.

3. A semiconductor device comprising:

a first conduction type substrate;

a gate electrode shaped in the form of an approximately quadrangular prism, having a rectangular top face, a bottom face opposite to the top face and having an area smaller than that of the top face, a first side surface, a second side surface opposite to the first side surface, a third side surface located between the first side surface and the second side surface, and a fourth side surface opposite to the third side surface and located between the first side surface and the second side surface, said gate electrode including a gate oxide layer provided directly on a surface of the first conduction type substrate, and a gate polysilicon layer provided directly on the gate oxide layer;

a second conduction type implantation region provided in the first conduction type substrate including a region located outside the gate electrode, said second conduction type implantation region including a first implantation region provided in junction with the first side surface, a second implantation region provided in junction with the second side surface, a third implantation region provided in junction with the third side surface, and a fourth implantation region provided in junction with the fourth side surface;

a sidewall that exposes the top face of the gate electrode and comprises a sidewall silicon oxide layer provided so as to cover the first side surface, the second side surface, the third side surface and the fourth side surface, an electron storage nitride layer including a first partial region opposite to the first side surface of the gate electrode, a second partial region opposite to the second side surface thereof, a third partial region opposite to the third side surface thereof, and a fourth partial region opposite to the fourth side surface thereof, and a sidewall mask oxide layer covering the electron storage nitride layer, said sidewall silicon oxide layer, said electron storage nitride layer and said sidewall mask oxide layer being laminated directly on one another; and a source/drain diffusion layer provided in the first conduction type substrate exposed from the gate electrode and the sidewall.

4. A semiconductor device comprising:

a first conduction type substrate;

a plurality of rectangular cell areas set over a surface of the first conduction type substrate in a matrix form;

gate electrodes each shaped in the form of an approximately quadrangular prism and having a rectangular top face, a bottom face opposite to the top face and having an area smaller than that of the top face, a first side surface, a second side surface opposite to the first side surface, a third side surface located between the first side surface and the second side surface, and a fourth side surface opposite to the third side surface and located between the first side surface and the second side surface, said gate electrode including a gate oxide layer provided directly on the surface of the first conduction type substrate, and a gate polysilicon layer provided directly on the gate oxide layer;

second conduction type implantation regions provided in the first conduction type substrate including regions located outside the gate electrodes said second conduction type implantation region including a first implantation region provided in junction with the first side surface, a second implantation region provided in junction with the second side surface, a third implantation region provided in junction with the third side surface, and a fourth implantation region provided in junction with the fourth side surface;

sidewalls each exposing the top face of the gate electrode and comprising a sidewall silicon oxide layer provided so as to cover the first side surface, the second side surface, the third side surface and the fourth side surface, an electron storage nitride layer including a first partial region opposite to the first side surface of the gate electrode, a second partial region opposite to the second side surface thereof, a third partial region opposite to the third side surface thereof, and a fourth partial region opposite to the fourth side surface thereof, and a sidewall mask oxide layer covering the electron storage nitride layer, said sidewall silicon oxide layer, said electron storage nitride layer and said sidewall mask oxide layer being laminated directly on one another; and source/drain diffusion layers each provided in the first conduction type substrate exposed from the gate electrode and the sidewall;

bit lines including a plurality of first bit lines each extending in a direction along a boundary between two of the cell areas adjacent to each other and being electrically connected to the source/drain diffusion layer brought into contact with the first implantation region in one of the two adjacent cell areas and the second implantation region in the other thereof, and a plurality of second bit lines electrically independent of the first bit lines and each being electrically connected to the source/drain diffusion layer brought into contact with the third implantation region in one of the two adjacent cell areas and the fourth implantation region in the other thereof; and a plurality of word lines extending in diagonal directions of the cell areas and being respectively electrically connected to the gate electrodes of the cell areas.

5. A semiconductor device comprising:

a first conduction type substrate;

a plurality of rectangular cell areas set over a surface of the first conduction type substrate in a matrix form;

gate electrodes each shaped in the form of an approximately quadrangular prism and having a rectangular top face, a first side surface, a second side surface opposite to the first side surface, a third side surface located between the first side surface and the second side surface, and a fourth side surface opposite to the third side surface and located between the first side surface and the second side surface, said first, second, third and fourth side surfaces being held in junction with respective sides of the top face, said gate electrodes each including a gate oxide layer provided over a respective one of the cell areas, a gate polysilicon layer provided over the gate oxide layer, and a gate silicon nitride layer provided over the gate polysilicon layer, and being respectively provided in the plurality of cell areas in such a manner that said first, second, third and fourth side surfaces are respectively made opposite to sides defining the respective cell area;

second conduction type implantation regions provided in the first conduction type substrate including regions located outside the gate electrodes, said second conduction type implantation region including a first implantation region provided in junction with the first side surface, a second implantation region provided in junction with the second side surface, a third implantation region provided in junction with the third side surface, and a fourth implantation region provided in junction with the fourth side surface;

sidewalls each exposing the top face of the gate electrode and covering the first side surface, the second side surface, the third side surface and the fourth side surface, and comprising a sidewall mask oxide layer, an electron storage nitride layer including a first partial region opposite to the first side surface of the gate electrode, a second partial region opposite to the second side surface thereof, a third partial region opposite to the third side surface thereof, and a fourth partial region opposite to the fourth side surface thereof, and a sidewall silicon oxide layer, said sidewall mask oxide layer, said electron storage nitride layer and said sidewall silicon oxide layer being laminated over one another;

source/drain diffusion layers each provided in the first conduction type substrate exposed from the gate electrode and the sidewall;

a plurality of first bit lines each extending in a direction along a boundary between two of the cell areas adjacent to each other and being located between the first and second side surfaces opposite with the boundary being interposed therebetween, and being electrically connected to the source/drain diffusion layer;

an embedded insulating film that buries the first bit lines and is made nonexistent in a region between the cell areas in which the first bit lines are nonexistent;

a plurality of second bit lines each extending in a direction along a boundary between the two adjacent cell areas and being located between the third side surface and the fourth side surface opposite with the boundary being interposed therebetween, said each second bit line extending over the source/drain diffusion layer electrically independent of the first bit line and beyond the embedded insulating film covering the first bit lines, and being electrically connected to the source/drain diffusion layer; and a plurality of word lines extending in diagonal directions of the cell areas and being electrically connected to the gate electrodes of the cell areas.

6. The method according to claim 5, wherein the first conduction type substrate is a P type substrate, and the second conduction type implantation regions are N type implantation regions.

* * * * *